United States Patent
Nakagawa et al.

(10) Patent No.: US 6,452,231 B1
(45) Date of Patent: Sep. 17, 2002

(54) SEMICONDUCTOR DEVICE

(75) Inventors: Akio Nakagawa, Yokohama; Yusuke Kawaguchi, Kanagawa-ken, both of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/126,777

(22) Filed: Jul. 31, 1998

(30) Foreign Application Priority Data

Jul. 31, 1997 (JP) ............................................. 9-206931
Jun. 30, 1998 (JP) ............................................ 10-199546

(51) Int. Cl.[7] ............................................. H01L 29/76
(52) U.S. Cl. ........................ 257/343; 257/378; 257/335
(58) Field of Search ................................. 257/343, 378, 257/408, 330, 335, 336, 337, 492, 493, 401

(56) References Cited

U.S. PATENT DOCUMENTS

| | | | | |
|---|---|---|---|---|
| 4,393,391 A | * | 7/1983 | Blanchard | 257/343 |
| 5,796,125 A | | 8/1998 | Matsudai et al. | 257/141 |
| 5,844,275 A | * | 12/1998 | Kitamura et al. | 257/343 |
| 6,316,807 B1 | * | 11/2001 | Fujishima et al. | 257/333 |

FOREIGN PATENT DOCUMENTS

| | | | | |
|---|---|---|---|---|
| JP | 4-93081 | * | 3/1992 | 257/343 |
| JP | 8-330601 | | 12/1996 | |

* cited by examiner

*Primary Examiner*—Mark V. Prenty
(74) *Attorney, Agent, or Firm*—Oblon, Spivak, McClelland, Maier & Neustadt, P.C.

(57) ABSTRACT

According to the present invention, there are proposed semiconductor devices each constituted in such a manner that the ON resistance thereof is lowered without increasing the area of the element. More specifically, as the insulated gate structure, there is used a trench gate structure constituted in such a manner that a gate electrode is formed in a state buried, through a gate insulation film, in trenches formed in the surface of an n-type high-resistance layer. Further, an n-type RESURF (Reduced Surface Field) diffused-layer extending as far as the trenches in a state contacted with the n-type drain layer is formed in the surface of the n-type high-resistance layer. As a result, the channel width can be increased with the area of the element remaining unvaried corresponding to the depth of the trenches to thereby reduce the channel resistance.

9 Claims, 29 Drawing Sheets

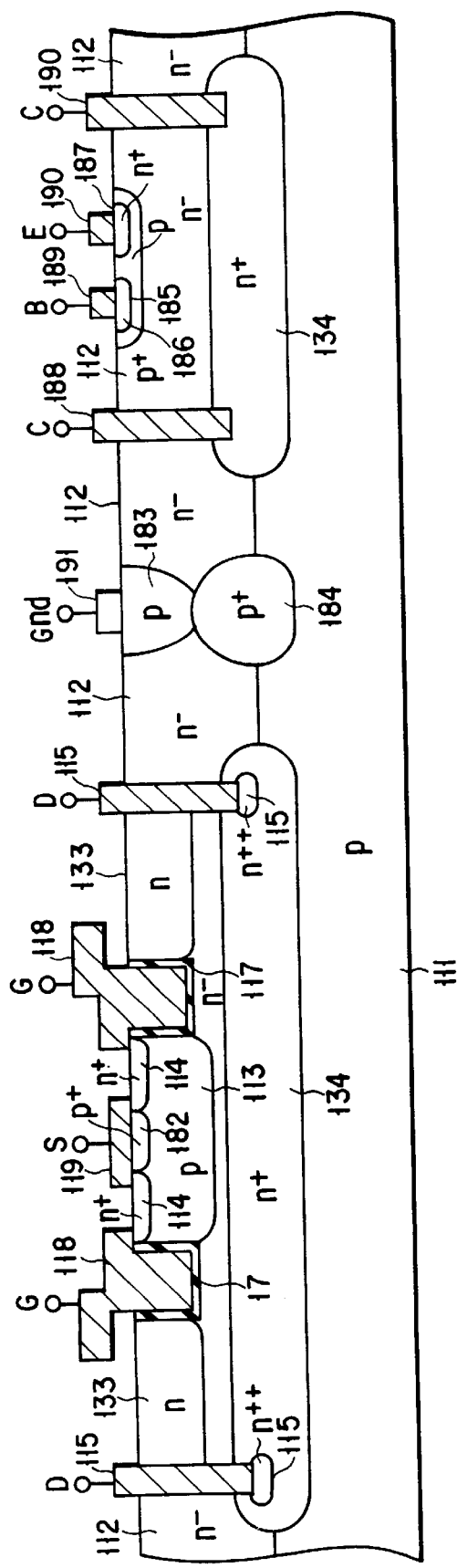
F I G. 53

SEMICONDUCTOR DEVICE

BACKGROUND OF THE INVENTION

The present invention relates to a semiconductor device, more particularly, a semiconductor device having a lateral MOSFET.

Hitherto, as a switching semiconductor device with a low breakdown voltage of about 8V to 60V, lateral MOSFET is known.

FIG. 1 is a plan view showing the structure of this type of lateral MOSFET, and FIG. 2 is a sectional view taken along the line 2—2 in FIG. 1 and seen in the direction indicated by arrows. This type of lateral MOSFET is constituted in such a manner that, on the surface of a p-type semiconductor substrate 1, a p-type well layer 2 is selectively formed, and, on the p-type well layer 2, an n-type drain layer 3 is selectively formed. On the p-type well layer 2, an n-type source layer 4 is formed at a position spaced apart from the n-type drain layer 3.

On that portion of the p-type well layer 2 which lies between the n-type drain layer 3 and the n-type source layer 4, a gate insulation film 5 is formed. On the gate insulation film 5, a gate electrode 6 is formed. On the n-type drain layer 3, a drain electrode 7 is formed. On the p-type well layer 2 and the n-type source layer 4, a source electrode 8 is formed.

This lateral MOSFET operates as follows:

If, when a positive voltage is applied to the drain electrode 7 and a negative voltage is applied to the source electrode 8, a positive voltage which is more positive than the voltage at the source is applied to the gate electrode 6, then that surface portion of the p-type well layer 2 which is adjacent to the gate insulation film 5 is inverted into the n conductivity type, and thus, electrons flow from the n-type source layer 4 to the n-type drain layer 3 through the inversion layer. That is, the element is brought into conduction.

In case such a lateral MOSFET is used for the switching of a large current, it is important in view of suppressing the loss to hold down the resistance (ON resistance) in the ON state of the lateral MOSFET. Here, the ON resistance of the lateral MOSFET is, for the most part, the resistance of the channel portion. Due to this, in order to decrease the ON resistance of the lateral MOSFET, the width of the channel thereof should be enlarged. However, if the channel width is enlarged, the area occupied by the lateral MOSFET is increased.

Further, in the case of a lateral MOSFET having a low breakdown voltage of, e.g. 30V, the ON resistance thereof is about 40 Ω·mm$^2$; and, any further decrease of the ON resistance has its limit.

As has been described above, in the case of a lateral MOSFET, there is the problem that, if the channel width is widened, the area occupied by the element is increased.

Further, in the case of a lateral MOSFET, current flows through only the surface thereof; and thus, there is a limit to the reduction of the ON resistance thereof.

BRIEF SUMMARY OF THE INVENTION

The object of the present invention is to provide a semiconductor device constituted in such a manner that the ON resistance thereof can be reduced to a substantial degree without increasing the area occupied by the element.

A lateral semiconductor device according to a first aspect of the invention is characterized by comprising an active region; a base region of a first conductivity type formed in the active region; a source region of a second conductivity type formed in the base region; a drift region of the second conductivity type formed in the active region; a drain region of the second conductivity type formed in the drift region; a plurality of trenches formed between the source and drift regions; and a gate electrode formed in the trenches.

Thus, according to the first aspect, the above-described means are adapted, so that the width of the channel can be widened, with the element's area kept the same, in accordance with the depth and the mounting density of the trenches: and therefore, the resistance of the channel portion of the element can be decreased, that is, the resistance of the element itself can be decreased, whereby the ON resistance thereof can be decreased.

Further, the device according to the first aspect may include an insulation layer formed under the gate electrode; and the gate electrode having a portion formed over the drift region and extended toward the drain region; wherein a thickness of the insulation layer under the portion is greater than a thickness of the insulation layer formed over a portion of the active region between the trenches.

Further, the device according to in the first aspect, the drain region may be formed substantially deeper than the source region. In addition, the device may include a buried electrode connected to the drain region.

Further, the device according to the first aspect may include a buried region of the second conductivity type formed in contact with the drain region and extending toward the base region. In addition, the buried region may have a higher conductivity than the active region.

Further, the device according to the first aspect may include a doped region of the second conductivity type formed in a surface region of the active region and connected to the drift region and extending between the base region and the drift region. In addition, the doped region may have a conductivity higher than the active region and lower than the drift region.

Further, the device according to the first aspect may include an interval between adjacent ones of the trenches being no greater than 0.8 μm, preferably no greater than 0.1 μm.

Further, the device according to the first aspect may include a channel region formed along the surfaces of the trenches.

A semiconductor device comprising a lateral MOSFET and bipolar, transistor according to a second aspect of the invention is characterized in that, the lateral MOSFET including: a first active region; a first base region of a first conductivity type formed in the first active region; a source region of a second conductivity type formed in the first base region; a drain region formed in the first active region; a plurality of trenches formed between the source and drain regions; a gate electrode formed in the trenches and over portions of the first active region disposed between the trenches; and a first buried region of the second conductivity type formed in contact with the drain region and extending toward the first base region; the bipolar transistor including: a second active region; a collector region of a second conductivity type formed in the second active region; a second base region of a first conductivity type formed on the collector region; an emitter region of a second conductivity type formed on the second base region; and a second buried region of the second conductivity type formed in the second active region under the collector region; wherein the first and second buried region are formed substantially with the same thickness and the same depth and the same concentration of a conductive impurity.

Thus, according to the second aspect, the above-described means are adapted, so that, by the first and second buried regions are formed substantially with the same thickness and the same depth and the same concentration of a conductive impurity, the first buried region of the lateral MOSFET and the second buried layer of the bipolar transistor can be formed by one and the same manufacturing step, so that the number of manufacturing steps can be reduced.

Additional objects and advantages of the present invention will be set forth in the description which follows, and in part will be obvious from the description, or may be learned by practice of the present invention.

The objects and advantages of the present invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrated presently preferred embodiments of the present invention and, together with the general description given above and the detailed description of the preferred embodiments given below, serve to explain the principles of the present invention.

FIG. 13 and seen in the direction indicated by arrows;

FIG. 53 is a sectional view showing the structure of the lateral trench MOSFET and bipolar transistor according to a twenty-second embodiment of the present invention.

DETAILED DESCRIPTION OF THE INVENTION

Figure 1:
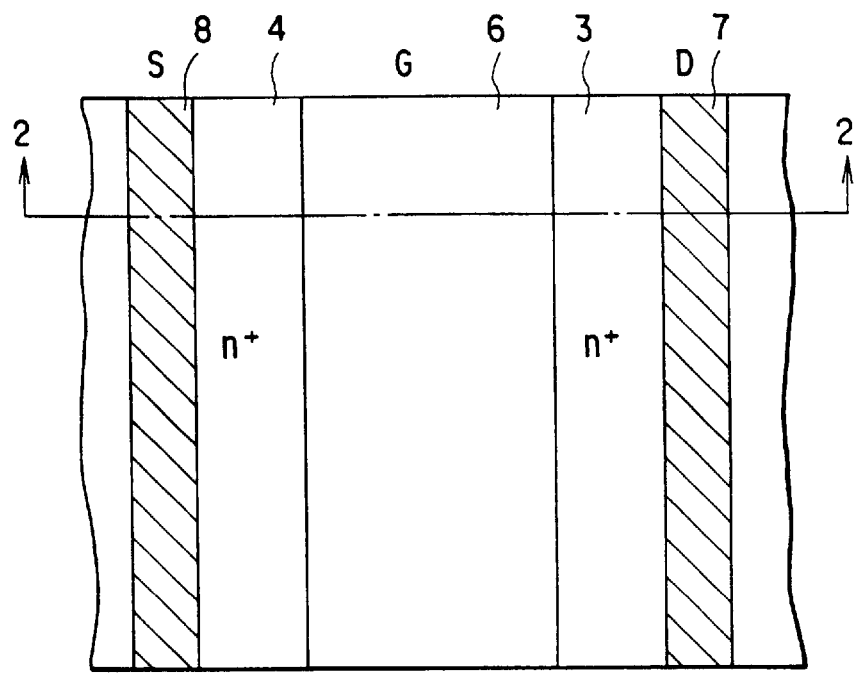
FIG. 1 is a plan view showing the structure of a conventional lateral MOSFET.
Figure 2:
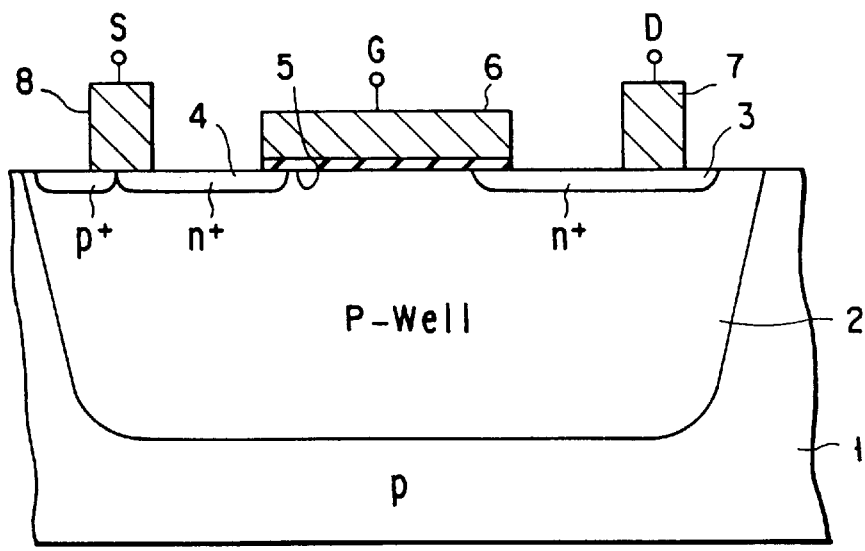
FIG. 2 is a sectional view taken along the line 2—2 in FIG. 1 and seen in the direction indicated by arrows.

Embodiments of the present invention will now be described referring to the drawings.

(First Embodiment)

Figure 3:
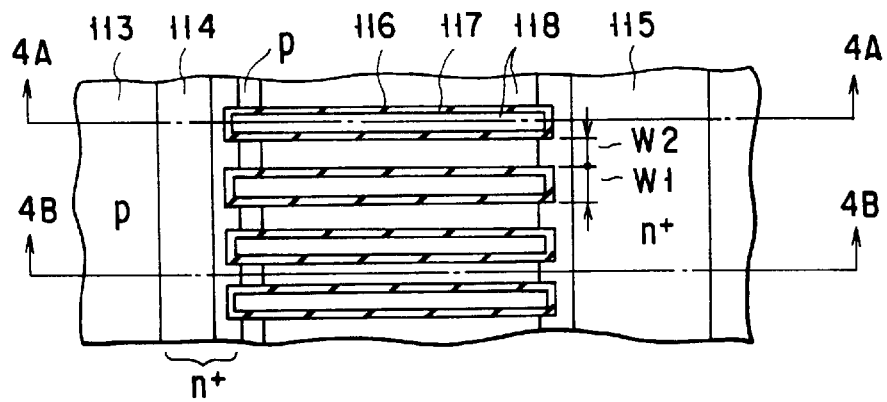
FIG. 3 is a plan view showing the structure of the lateral trench MOSFET according to a first embodiment of the present invention.
Figure 4A:
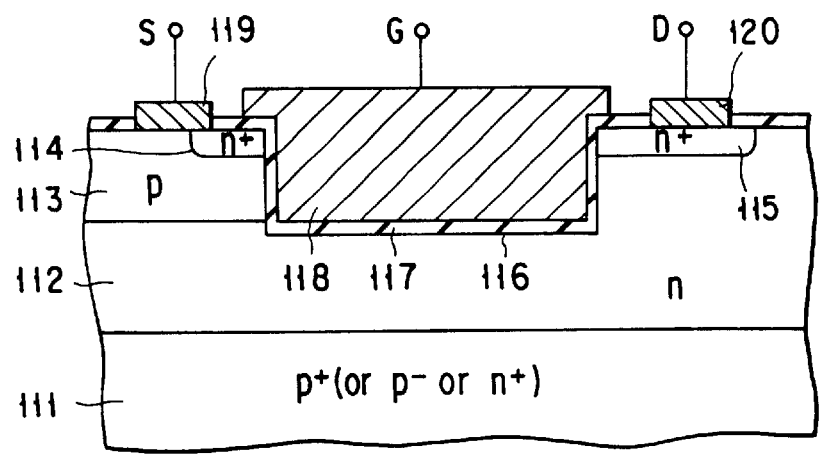
FIG. 4A is a sectional view taken along the line 4A—4A in FIG. 3 and seen in the direction indicated by arrows.
Figure 4B:
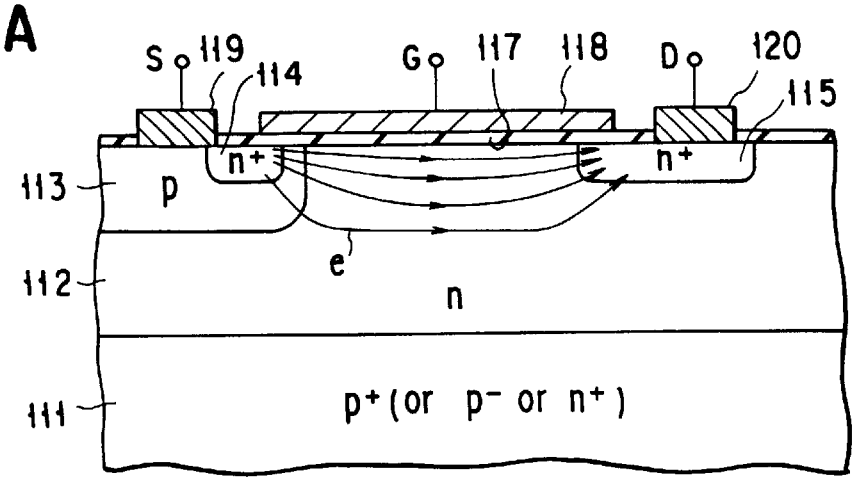
FIG. 4B is a sectional view taken along the line 4B—4B in FIG. 3 and seen in the direction indicated by arrows.

FIG. 3 is a plan view showing the structure of the lateral trench MOSFET according to a first embodiment of the present invention, FIG. 4A is a sectional view taken along the line 4A—4A in FIG. 3 and seen in the direction indicated by arrows, and FIG. 4B is a sectional view taken along the line 4B—4B in FIG. 3. This lateral trench MOSFET is constructed in such a manner that, on a p-type substrate 111, an n-type high-resistance layer 112 is formed. On the n-type high-resistance layer 112, a stripe-shaped p-type well layer 113 is selectively formed. On the surface of the p-type well layer 113, a stripe-shaped n-type source layer 114 is selectively formed. On the other hand, on a portion of the surface of the n-type high-resistance layer 112 which (portion) is positioned apart from the n-type source layer 114, a stripe-shaped n-type drain layer 115 is formed so as to be parallel to the n-type source 114.

In the intermediate region extending from the end portion of the n-type drain layer 115 to the end portion of the n-type source layer 114 through the n-type high-resistance layer 112 and the p-type well layer 113, a plurality of trenches 116 are formed extending through the p-type well layer 113 to an intermediate depth of the n-type high-resistance layer 112. Further, the respective trenches 16 each have a stripe-like planar shape perpendicular to the n-type source layer 114 and the n-type drain layer 115 and are disposed in parallel to one another. Further, as the plane orientation of the surfaces of the trenches 116, the (100) plane can be used.

Further, in an intermediate region between the drain and source and the respective trenches 116, gate electrodes 118 composed of polycrystalline silicon are formed through a gate insulation film 117. On the n-type source layer 114, a source electrode 119 is formed. On the n-type drain layer 115, a drain electrode 120 is formed.

Next, the operation of the lateral trench MOSFET which is constructed as described above will be explained below.

As already stated, if, when a positive voltage is applied to the drain electrode 120, and a negative voltage is applied to the source electrode 119, a positive voltage which is more positive than the voltage applied to the source is applied to the gate electrodes 118, then that surface portion of the p-type well layer 113 which is contacted with the gate electrodes 118 is inverted into the n conductivity type, so that electrons are injected from the n-type source layer 114 into the n-type high-resistance layer 112 through the inversion layer, thus flowing through the n-type high-resistance layer 112 towards the n-type drain layer 115 and thus reaching said n-type drain layer 115. That is, the element is brought into conduction.

In this case, also in the interior of the n-type high-resistance layer 112, a channel is formed along the trenches 116, so that the electrons e flow spreading inside as shown in FIG. 4B. Thus, depending on the width of the internal channel, the ON resistance can be decreased. The degree of decrease in this ON resistance, though it depends on the element design, can be expected to be 1/10 or less as compared with the case of the conventional planar structure.

Figure 5:
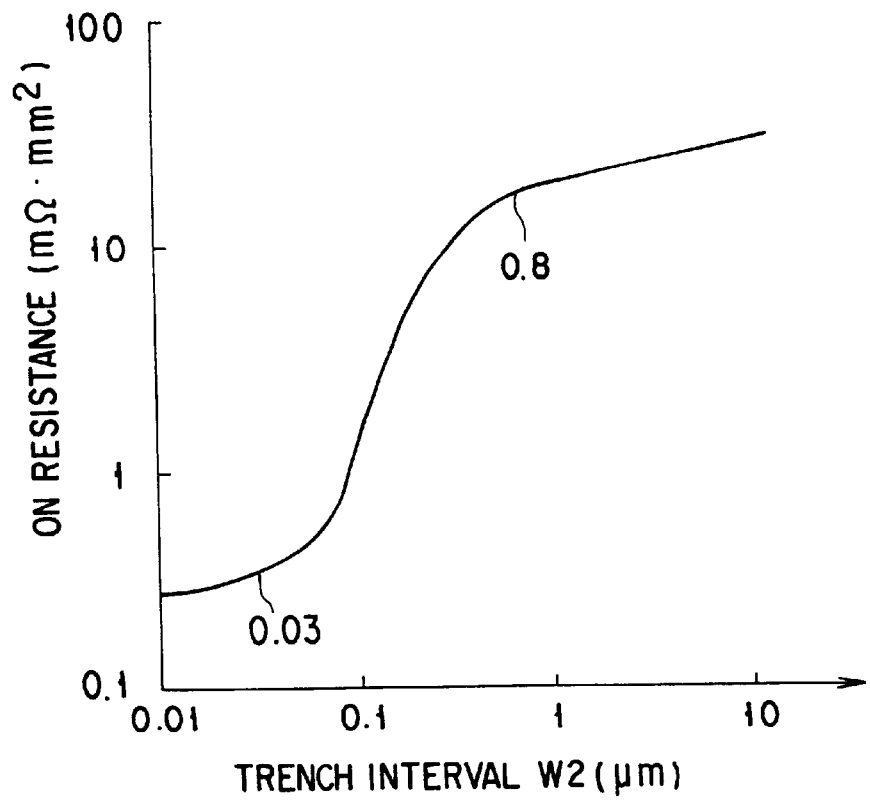
FIG. 5 is a schematic diagram showing, by the use of a logarithmic scale, the dependence on the trench interval of the ON resistance of the lateral trench MOSFET according to the same embodiment.

FIG. 5 is a graph showing, by the use of a logarithmic scale, the dependence on the trench interval of the ON resistance in the lateral trench MOSFET which is formed on the monocrystalline silicon. As shown, as the trench interval W2 is narrowed, the channel width per unit area increases, so that the ON resistance can be reduced. In particular, when the trench interval W2 is in the range of from 0.8 to 0.1 $\mu$m, the ON resistance assumes, practically, a sufficiently small value and thus desirable. However, In case the trench interval is less than 0.01 $\mu$m, the channel mobility is lowered due to the influence by the surface scattering to increase the ON resistance; and thus, such a trench interval is not desirable.

In this connection, the ON resistance of a conventional lateral planar MOSFET with a breakdown voltage of 30V is 40 m$\Omega$·mm$^2$, and the ON resistance of a conventional vertical trench MOSFET is 30 m$\Omega$·mm$^2$.

On the other hand, as the On resistance of the lateral trench MOSFET according to the present invention, a value of 1 m$\Omega$·mm$^2$ or below can be expected if the trench interval W2 and the trench width W1 are both 0.1 $\mu$m. This value is smaller than 1/10 of that of a conventional vertical trench MOSFET. Further, if the trench interval W2 and the trench interval W1 are both alike 0.05 $\mu$m, then the ON resistance of the lateral trench MOSFET according to the present invention turns out to be 0.3 m$\Omega$·mm$^2$; thus, it is clear that the ON resistance of the lateral trench MOSFET according to the present invention is decreased to 1/100 with reference to the ON resistance of the conventional vertical trench MOSFET.

Thus, it is apparent that the lateral trench MOSFET according to the present invention is overwhelmingly superior to vertical MOSFET using trenches of the same size. Further, in general, a lateral element is inferior in characteristics to a vertical element; and thus, it is all the more clarified that the ON resistance decreasing effect according to the present invention is very excellent.

Further, in the case of the lateral trench MOSFET according to the present invention, the ON resistance thereof can be decreased to a lower value than that of a general vertical element when said general vertical trench MOSFET has a breakdown voltage of about 60V or below. The reason therefor lies in that, in the case of the lateral trench MOSFET according to the present invention, the intervals between the trenches thereof can be reduced without limitation.

Figure 6:
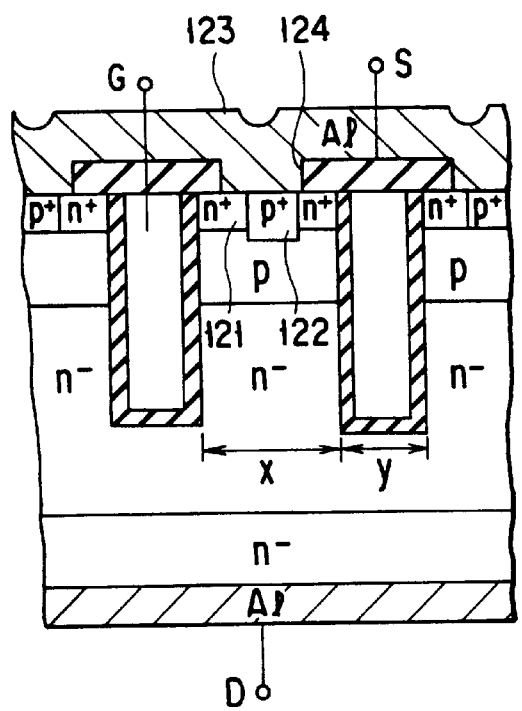
FIG. 6 is a sectional view of a conventional element for explaining the effects of the same embodiment.

For instance, in the case of a vertical trench MOSFET, an n-type source layer 121, a p-type contact layer 122 and a source electrode 123 need to be contacted in the upper portion as shown in FIG. 6. Here, it should be noted that, in the case of the vertical trench MOSFET, a contact hole for contact must be provided, so that the trench interval W2 cannot be narrowed to a value smaller than 3 $\mu$m in the existing state of the vertical trench MOSFET.

On the other hand, in the case of a lateral trench MOSFET, there is no such restriction, so that the trench interval can be narrowed even to about 0.1 $\mu$m; and thus, the channel width per unit area is more than five times as large as that of a vertical trench MOSFET. As a result, the ON resistance of the lateral trench MOSFET can be reduced as mentioned above.

As described above, according to the present invention, the ON resistance can be reduced without increasing the area of the element.

(Second Embodiment)

Figure 7:
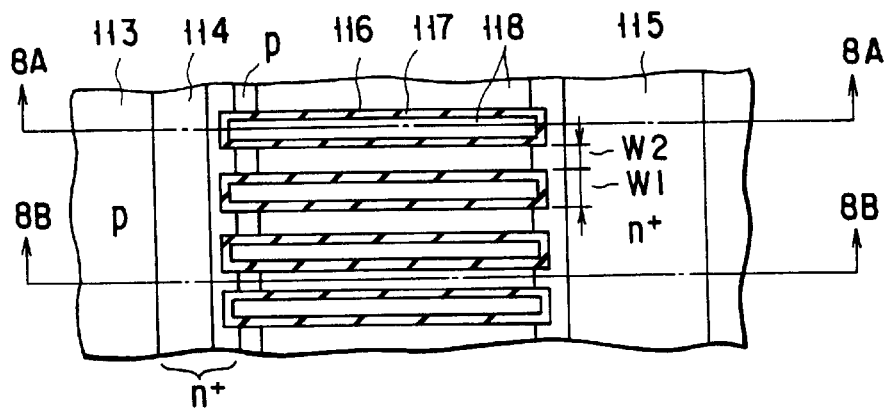
FIG. 7 is a plan view showing the structure of the lateral trench MOSFET according to a second embodiment of the present invention.
Figure 8A:
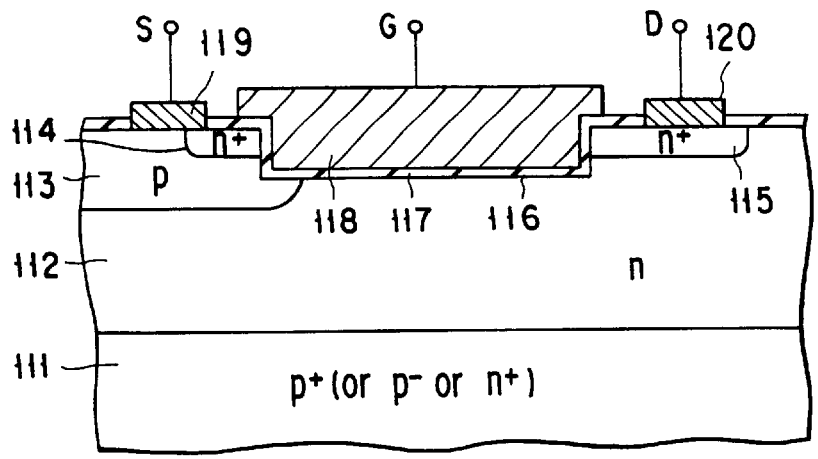
FIG. 8A is a sectional view taken along the line 8A—8A in FIG. 7 and seen in the direction indicated by arrows.
Figure 8B:
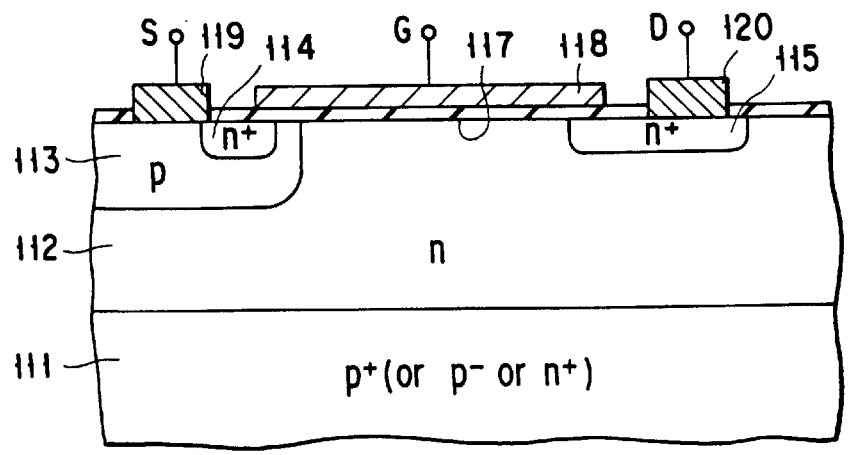
FIG. 8B is a sectional view taken along the line 8B—8B in FIG. 7 and seen in the direction indicated by arrows.

FIG. 7 is a plan view showing the structure of the lateral trench MOSFET according to an second embodiment of the present invention, FIG. 8A is a sectional view taken along the line 8A—8A in FIG. 7 and seen in the direction indicated by arrows, and FIG. 8B is a sectional view taken along the line 8B—8B in FIG. 7 and seen in the direction indicated by arrows. In FIG. 7, FIG. 8A and FIG. 8B, the same portions as those shown in FIG. 3 are referenced by the same reference numerals and symbols for omission of the repetition of the detailed description thereof; here, only different portions will be described. Further, in the description of the embodiments to follow, the repetition of the description of the same technical contents will also be avoided.

This embodiment is a structural modification of the first embodiment and is constituted in such a manner that, as shown, the depth d of the trenches 116 is set so as to be smaller than that of the p-type well 113, and the trench interval W2 and the trench width W1 are made further smaller.

By constructing the semiconductor device in this way, there can be obtained the effect, in addition to the effects of the first embodiment, that, when the trench interval W2 is set to 0.1 $\mu$m or less, all the portions of the n-type high-resistance layer 112 each sandwiched between the respective trenches become a channel to markedly reduce the ON resistance. This is the effect which can be achieved only by the lateral trench MOSFET.

(Third Embodiment)

Figure 9:
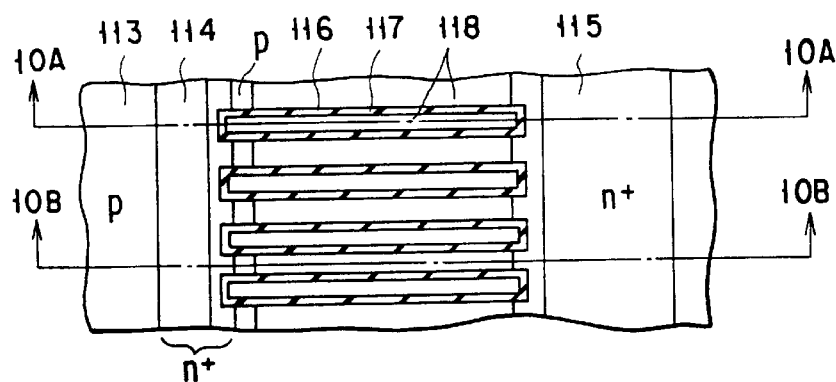
FIG. 9 is a plan view showing the structure of the lateral trench MOSFET according to a third embodiment of the present invention.
Figure 10A:
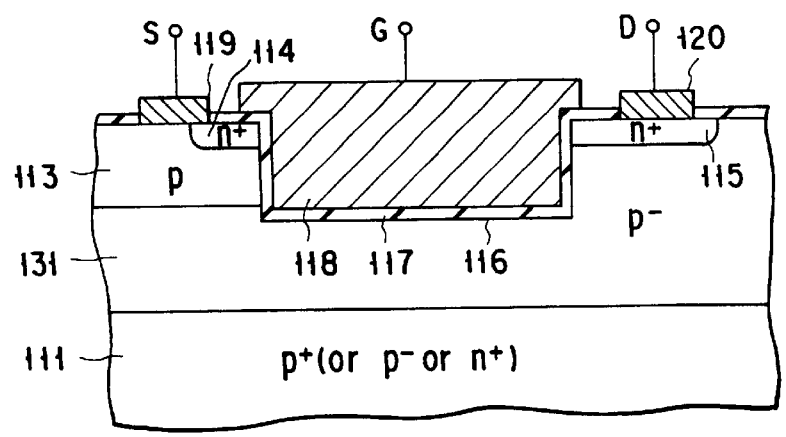
FIG. 10A is a sectional view taken along the line 10A—10A in FIG. 9 and seen in the direction indicated by arrows.
Figure 10B:
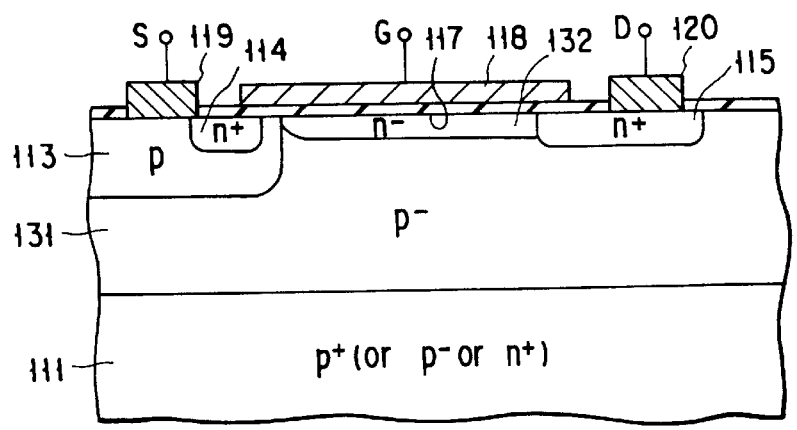
FIG. 10B is a sectional view taken along the line 10B—10B in FIG. 9 and seen in the direction indicated by arrows.

FIG. 9 is a plan view showing the structure of the lateral trench MOSFET according to a third embodiment of the present invention, FIG. 10A is a sectional view taken along the line 10A—10A in FIG. 9 and seen in the direction indicated by arrows, and FIG. 10B is a sectional view taken along the line 10B—10B in FIG. 9 and seen in the direction indicated by arrows.

This embodiment is a structural modification of the first embodiment and is constructed in such a manner that, in place of the n-type high-resistance layer 112, a p-type high-resistance layer 131 is formed. Further, in that surface portion of the p-type high-resistance layer 131 which lies between the p-type well layer 113 and the n-type drain layer 115, an n-type RESURF (Reduced Surface Field) diffused layer 132 is formed.

According to this structure, there can be obtained the effect, in addition to the effects of the first embodiment, that the breakdown voltage can be enhanced due to the electric field relaxation caused by the n-type RESURF diffused layer 132.

(Fourth Embodiment)

Figure 11:
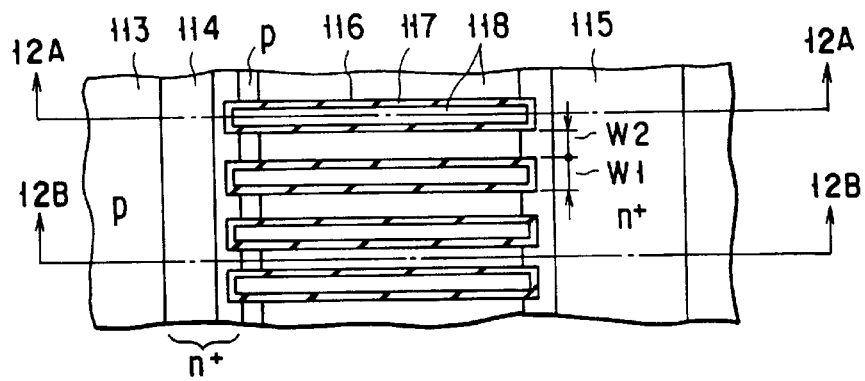
FIG. 11 is a plan view showing the structure of the lateral trench MOSFET according to a fourth embodiment of the present invention.
Figure 12A:
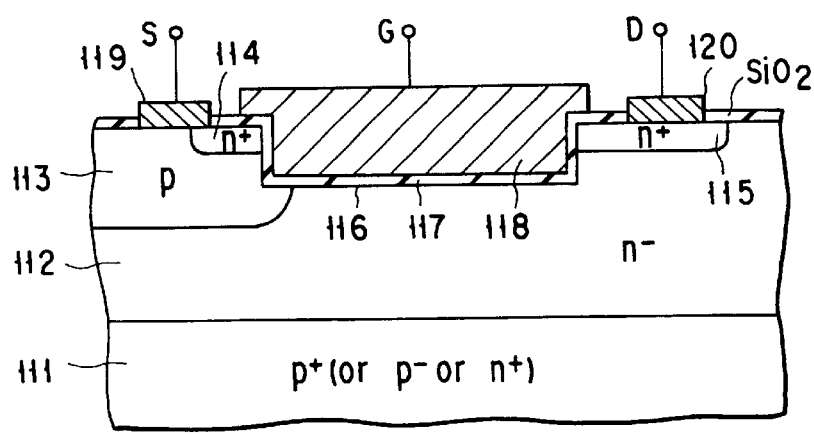
FIG. 12A is a sectional view taken along the line 12A—12A in FIG. 11 and seen in the direction indicated by arrows.
Figure 12B:
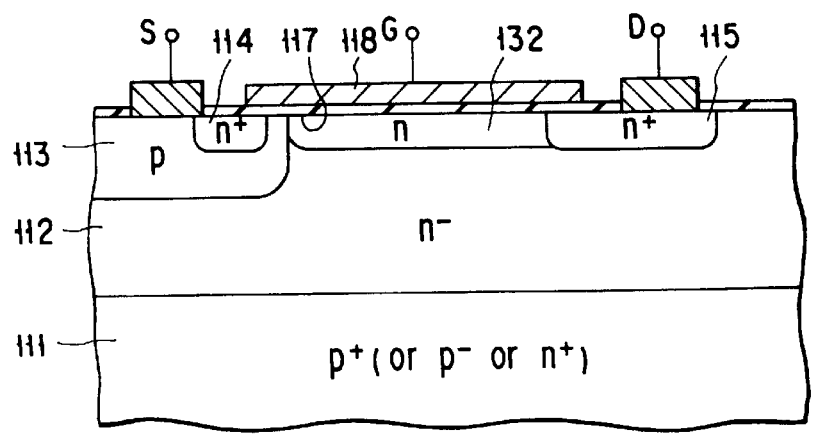
FIG. 12B is a sectional view taken along the line 12B—12B in FIG. 11 and seen in the direction indicated by arrows.

FIG. 11 is a plan view showing the structure of the lateral trench MOSFET according to a fourth embodiment of the present invention, FIG. 12A is a sectional view taken along the line 12A—12A in FIG. 11 and seen in the direction indicated by arrows, and FIG. 12B is a sectional view taken along the line 12B—12B in FIG. 11 and seen in the direction indicated by arrows.

This embodiment is a structural modification of the first embodiment and is constituted in such a manner that, in that surface portion of the n-type high-resistance layer 112 which lies between the p-type well layer 113 and the n-type drain layer 115, an n-type RESURF diffused layer 132 is formed.

According to this structure, there can be obtained effect, in addition to the effects of the first embodiment, that the breakdown voltage can be enhanced due to the electric field relaxation caused by the n-type RESURF diffused layer 132.

Further, this embodiment is also applicable as a structural modification of the second embodiment.

(Fifth Embodiment)

Figure 13:
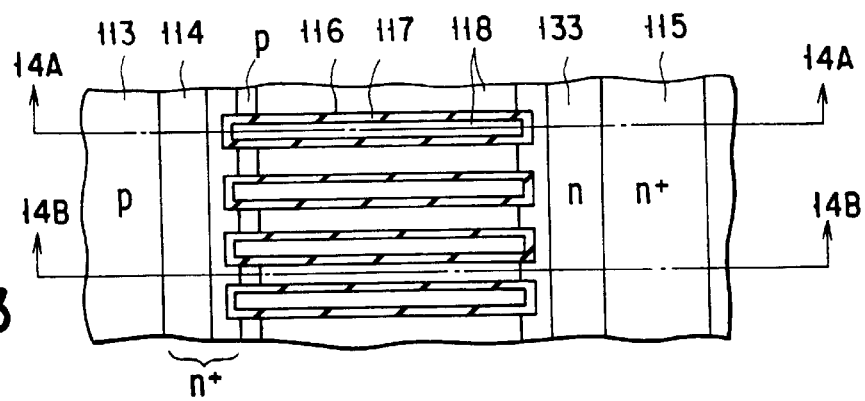
FIG. 13 is a plan view showing the structure of the lateral trench MOSFET according to a fifth embodiment of the present invention.
Figure 14A:
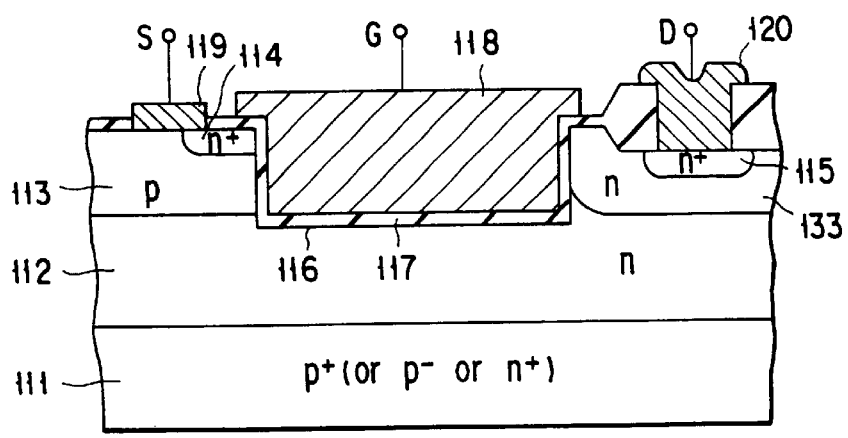
FIG. 14A is a sectional view taken along the line 14A—14A in FIG.
Figure 14B:
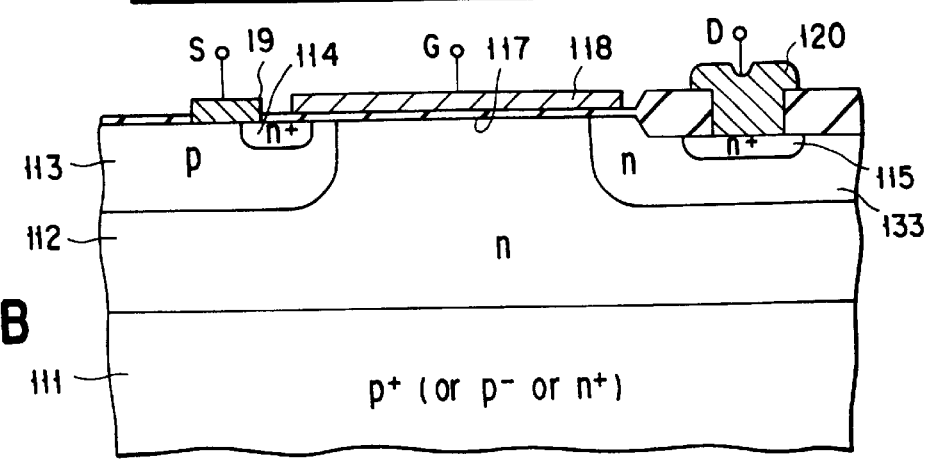
FIG. 14B is a sectional view taken along the line 14B—14B in FIG. 13 and seen in the direction indicated by arrows.

FIG. 13 is a plan view showing the structure of the lateral trench MOSFET according to a fifth embodiment of the present invention, FIG. 14A is a sectional view taken along the line 14A—14A in FIG. 13 and seen in the direction indicated by arrows, and FIG. 14B is a sectional view taken along the line 14B—14B in FIG. 13 and seen in the direction indicated by arrows.

This embodiment is a structural modification of the first embodiment and is constituted in such a manner that, between the n-type drain layer 115 and the n-type high-resistance layer 112, an offset layer (drift region) 133 which has a resistance higher than that of the n-type high-resistance layer 112 is formed.

According to this structure, there can be obtained the effect, in addition to the effects of the first embodiment, that the breakdown voltage of the element can be enhanced by the resistance component of the n-type offset layer 133. In this connection, it is added that this embodiment is applicable to any of the first to fourth embodiments.

Figure 15:
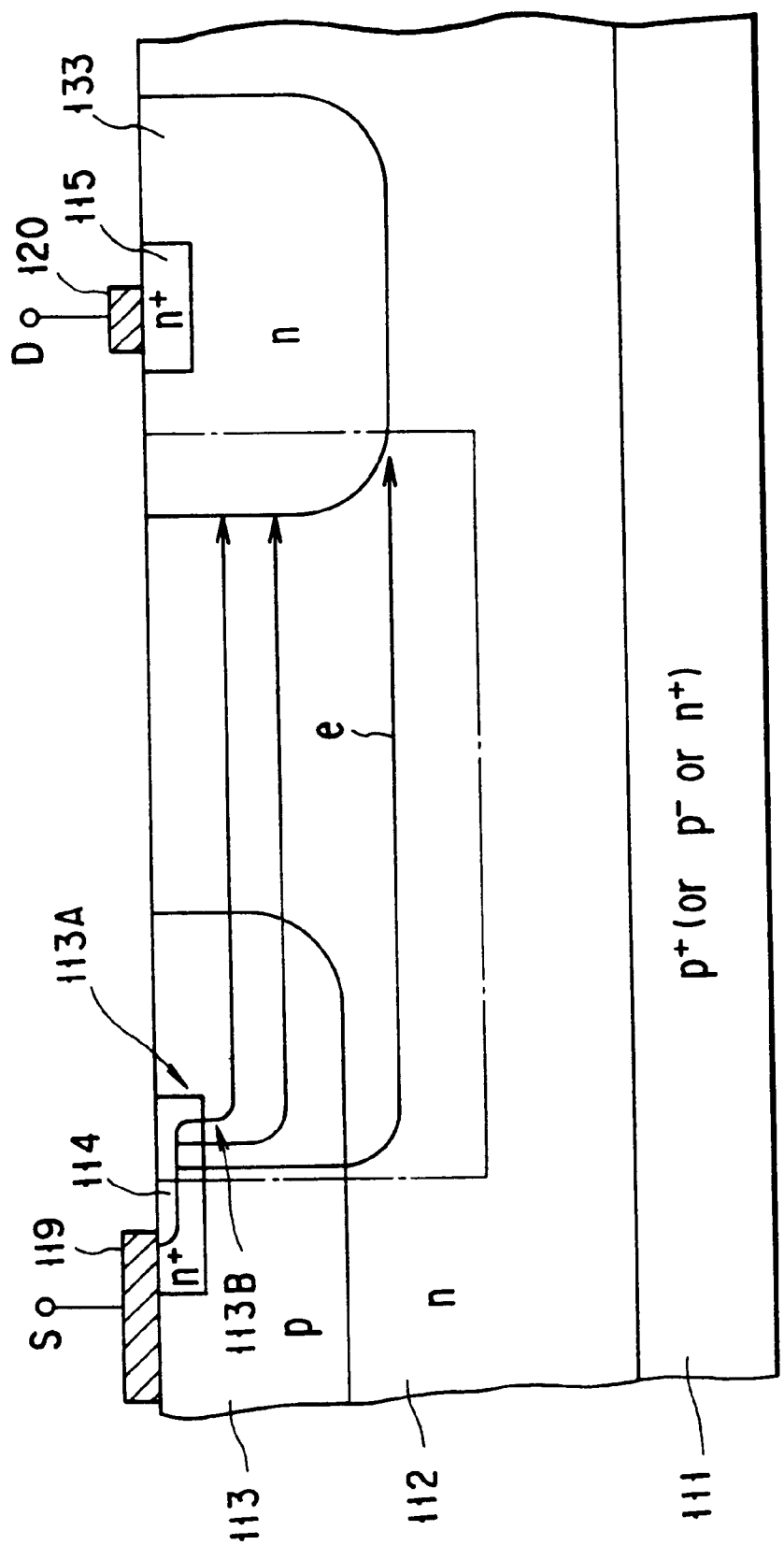
FIG. 15 is a schematic diagram for explaining the optimum mode of the fifth embodiment.

Further, a supplementary explanation is made with reference to the case where, in this embodiment, the p-type well layer 113 is formed by diffusion without using the Diffusion Self-Alignment (DSA) method, and thereafter, the n-type source layer 114 is formed by diffusion. In this case, as for the concentration of the portions (113A and 113B) of the p-type well layer 113 which lie in the vicinity of the junction thereof with the n-type source layer 114, the concentration of the portion 113B lying under the n-type source layer 114 is lower than that of the portion 113A lying adjacent to the side face of the n-type source layer 114. Due to this, electrons e are injected into the channel from the portion 113B which has a lower threshold voltage value, as shown in FIG. 15. Accordingly, the portions 113B between the respective trenches 116 are formed large in size, whereby the electrons can be easily injected to reduce the element resistance.

(Sixth Embodiment)

Figure 16:
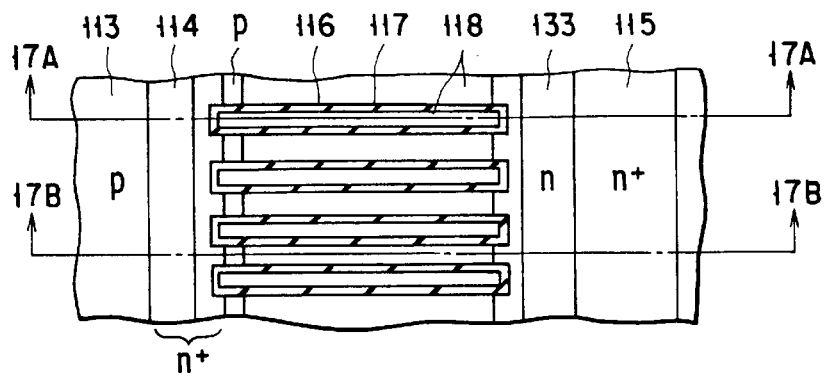
FIG. 16 is a plan view showing the structure of the lateral trench MOSFET according to a sixth embodiment of the present invention.
Figure 17A:
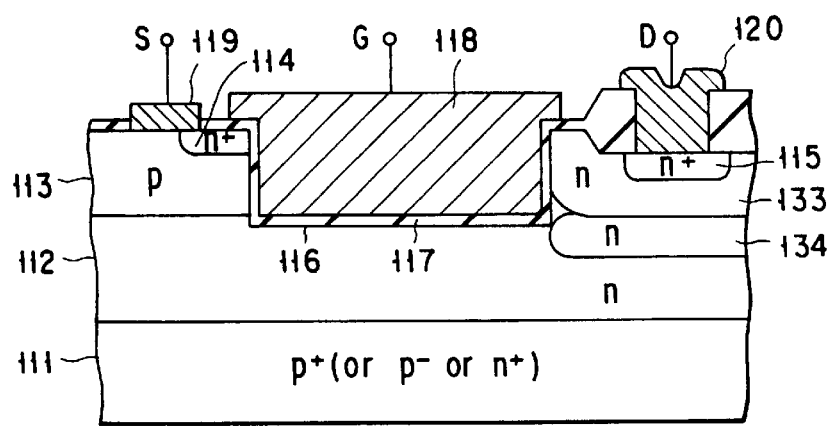
FIG. 17A is a sectional view taken along the line 17A—17A in FIG. 16 and seen in the direction indicated by arrows.
Figure 17B:
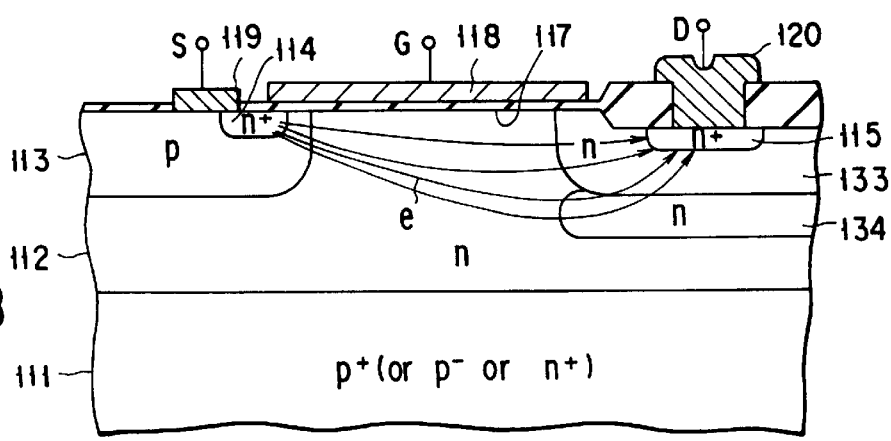
FIG. 17B is a sectional view taken along the line 17B—17B in FIG. 16 and seen in the direction indicated by arrows.

FIG. 16 is a plan view showing the structure of the lateral trench MOSFET according to a sixth embodiment of the present invention, FIG. 17A is a sectional view taken along the line 17A—17A in FIG. 16 and seen in the direction indicated by arrows, and FIG. 17B is a sectional view taken along the line 17B—17B in FIG. 16 and seen in the direction indicated by arrows.

This embodiment is a structural modification of the sixth embodiment and is constituted in such a manner that, directly under the n-type offset layer 133, there is formed an n-type buried layer 134 having a resistance lower than that of the n-type high-resistance layer 112. In this case, the n-type buried layer 134 is formed in such a manner that the end of said n-type buried layer 134 which (end) is closer to the source is located at approximately the same position—with reference to the vertical direction—as the end of the n-type offset layer 133 which (end) is closer to the source.

According to this structure, it is ensured that, in the conductive state of the element, the electrons e injected into the n-type high-resistance layer 112 pass by the side faces of the trenches 116 to reach the n-type buried layer 134 and then flow through the n-type buried layer 134 and through the n-type offset layer 133 to the n-type drain layer 115.

That is, as a result of providing the n-type buried layer 134 directly under the n-type offset layer 133, the electrons flow into the n-type buried layer 134, sufficiently spreading within the channel width along the side faces of the trenches 116, and therefore, the ON resistance can be further reduced.

Here, it is added that, according to this embodiment, the n-type drain layer 115 is formed at a position lower than the position of the n-type source layer, as shown in FIG. 17A and FIG. 17B, in order to spread the stream of electrons, but this is a modified structure; it is a matter of course that the position of the n-type drain layer 115 can be brought up to the same plane as the position of the n-type source layer.

(Seventh Embodiment)

Figure 18:
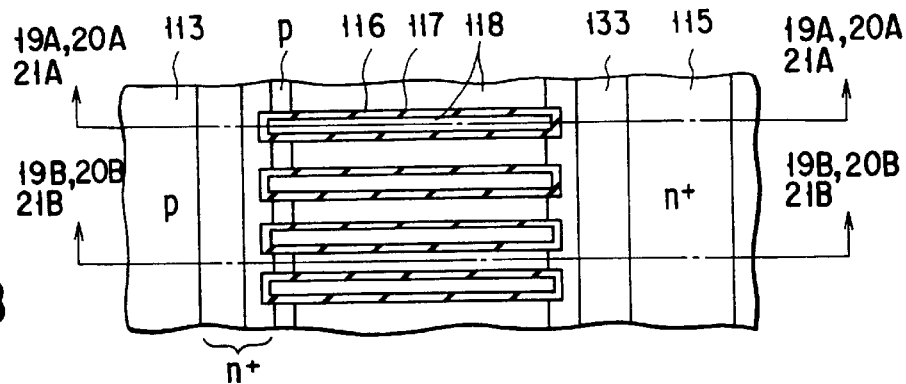
FIG. 18 is a plan view showing the structure of the lateral trench MOSFET according to a seventh embodiment of the present invention.
Figure 19A:
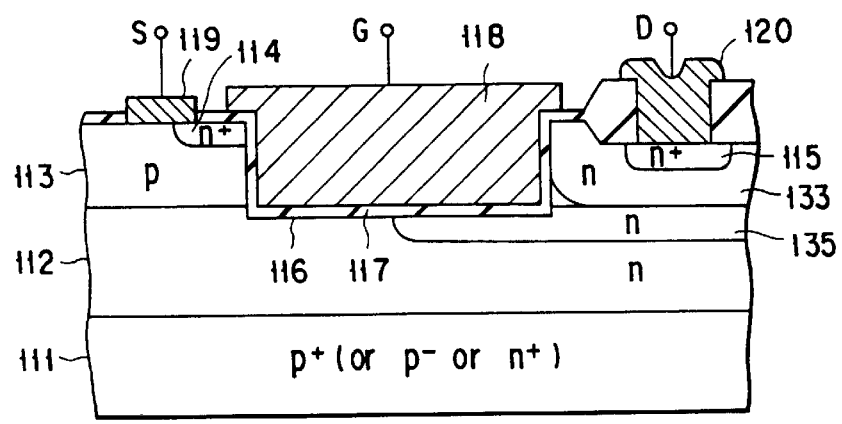
FIG. 19A is a sectional taken along the line 19A—19A in FIG. 18 and seen in the direction indicated by arrows.
Figure 19B:
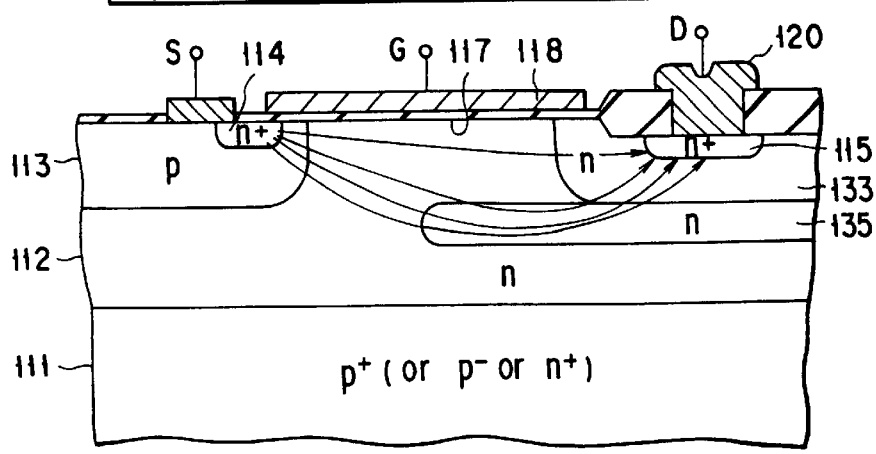
FIG. 19B is a sectional view taken along the line 19B—19B in FIG. 18 and seen in the direction indicated by arrows.

FIG. 18 is a plan views a plan view showing the structure of the lateral trench MOSFET according to a seventh embodiment of the present invention, FIG. 19A is a sectional view taken along the line 19A—19A in FIG. 18 and seen in the direction indicated by arrows, and FIG. 19B is a sectional view taken along the line 19B—19B in FIG. 18 and seen in the direction indicated by arrows.

This embodiment is a structural modification of the sixth embodiment and is constituted in such a manner that the low-resistance n-type buried layer 135 formed directly under the n-type offset layer 133 is provided in a state extended as far as the vicinity of the middle point between the drain and source.

According to this structure, the electrons e flow into the n-type buried layer 135, sufficiently spreading within the channel width along the side faces of the trenches as in the case of the sixth embodiment, so that the ON resistance can be further reduced. Moreover, since, in the case of this embodiment, the n-type buried layer 135 is provided in a state extending as far as the vicinity of the middle point between the drain and the source, the degree of spreading the stream of electrons e can be enhanced as compared with the case of the sixth embodiment, as shown in FIG. 19B, and thus, the ON resistance can be further decreased.

Further, in the case of the sixth and seventh embodiments, the ON resistance can be decreased in proportion as the n-type buried layers 134 and 135 are extended towards the source side, but it is also desirable to form the n-type offset layer 133 in a state extending more deeply or downwards to enhance the breakdown voltage.

Further, in FIG. 19A, the depth of the p-type base layer 113 and the depth of the trench 116 are shown as approximately equal to each other, but it is desirable to make the p-type base layer 113 shallower than the trench 116, since, if so, the channel length can be more easily controlled.

Figure 20A:
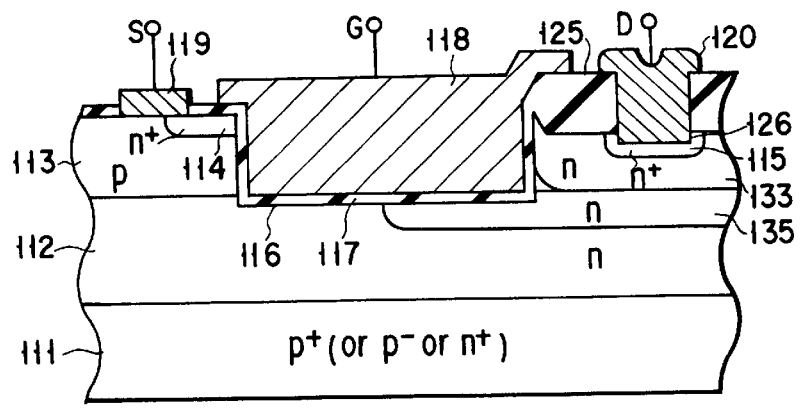
FIG. 20A is a sectional view taken along the line 20A—20A in FIG. 18 and seen in the direction indicated by arrows.
Figure 20B:
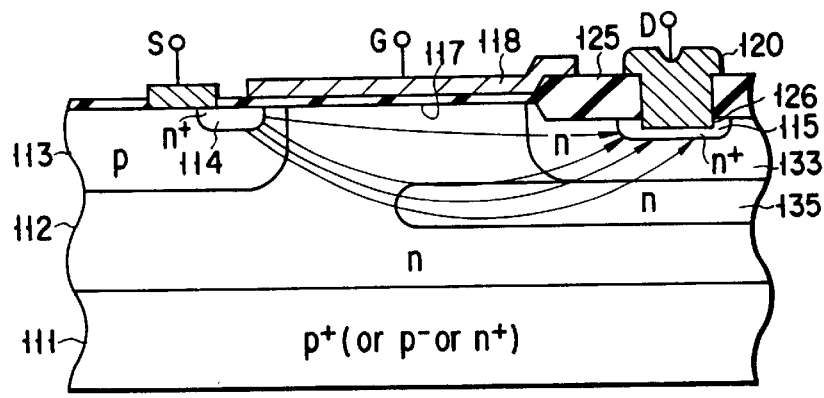
FIG. 20B is a sectional view taken the line 20B—20B in FIG. 18 and seen in the direction indicated by arrows.

Further, this embodiment may be modified in such a manner that, as shown in FIG. 20A and FIG. 20B, an insulation film 125 which is thicker than the gate insulation film 117 is formed between the gate electrode 118 and the drain electrode 120, and the drain electrode 120 is projected as far as an intermediate depth of the n+ type drain layer 115 through the trench 126.

Figure 21A:
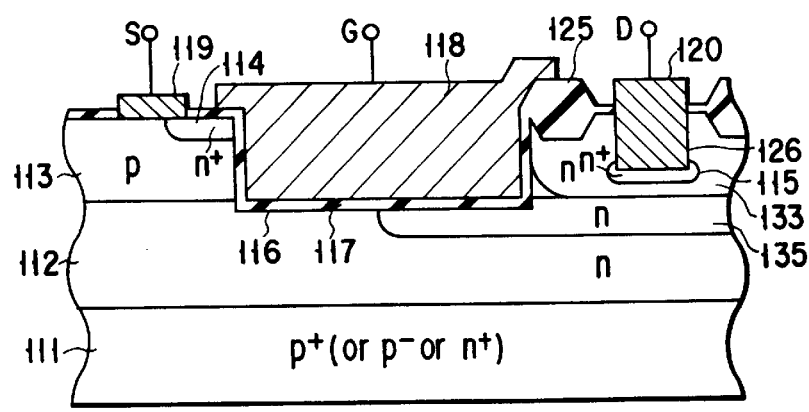
FIG. 21A is a sectional view taken along the line 21A—21A in FIG. 18 and seen in the direction indicated by arrows.
Figure 21B:
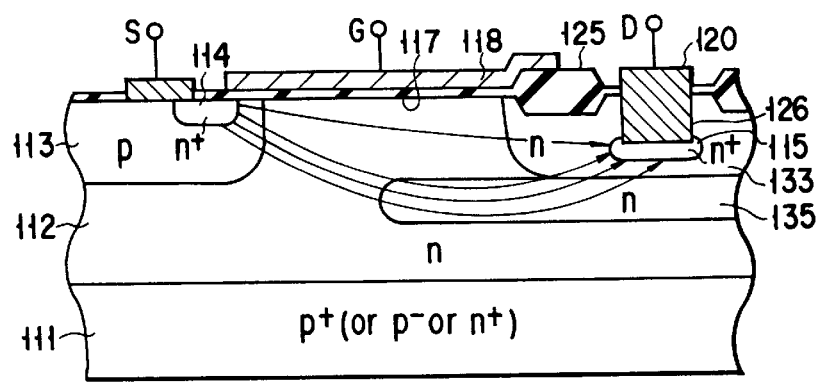
FIG. 21B is a sectional view taken the line 21B—21B in FIG. 18 and seen in the direction indicated by arrows.

This embodiment may further be modified in such a manner that, as shown in FIG. 21A and FIG. 21B, an insulation film 125 which is thicker than the gate insulation film 117 is formed between the gate electrode 118 and the drain electrode 120 in a state separated from the drain electrode 120, the drain electrode 120 is projected as far as an intermediate depth of the n-type offset layer 133, and an n+ type drain layer 115 is interposed between the bottom of the drain electrode 120 and the n-type offset layer 133.

According to the respective modifications of shown in FIGS. 20A and 20B and FIGS. 21A and 21B, there can be obtained the effect, in addition to the effects of this embodiment, the electric field in the surface of the n-type offset layer 133 when in OFF state can be relaxed to improve the breakdown voltage.

(Eighth Embodiment)

Figure 22:
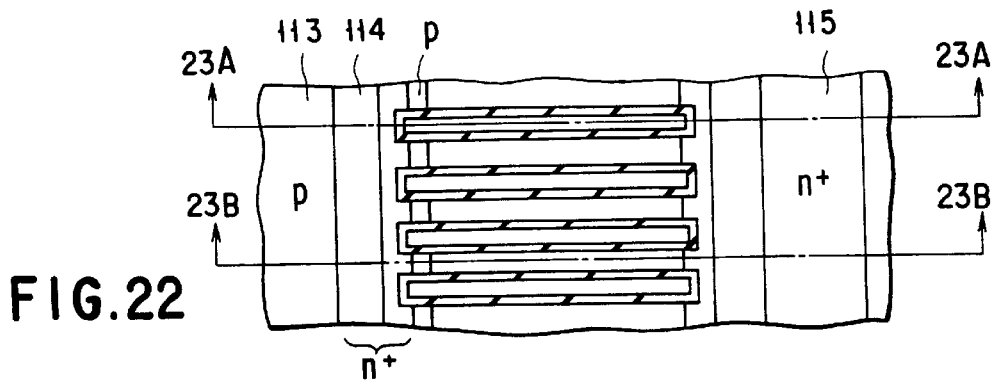
FIG. 22 is a plan view showing the structure of the lateral trench MOSFET according to an eighth embodiment of the present invention.
Figure 23A:
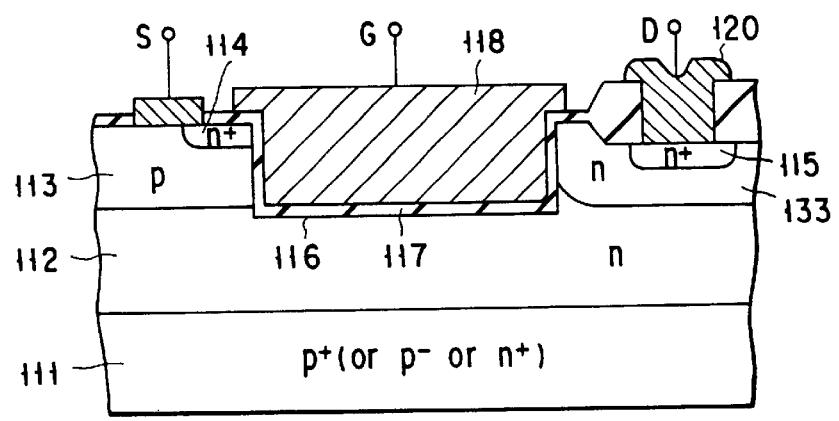
FIG. 23A is a sectional view taken along the line 23A—23A in FIG. 22 and seen in the direction indicated by arrows.
Figure 23B:
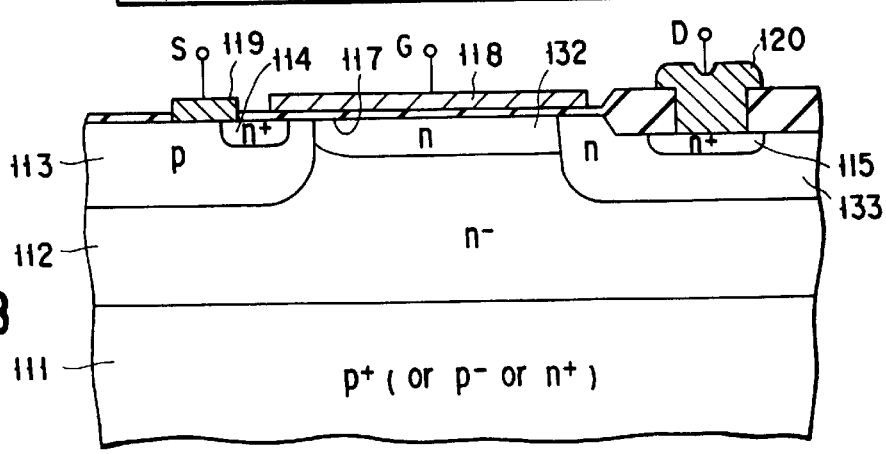
FIG. 23B is a sectional view taken the line 23B—23B in FIG. 22 and seen in the direction indicated by arrows.

FIG. 22 is a plan view showing the structure of the lateral trench MOSFET according to an eighth embodiment of the present invention, FIG. 23A is a sectional view taken along the line 23A—23A in FIG. 22 and seen in the direction indicated by arrows, and FIG. 23B is a sectional view taken along the line 23B—23B in FIG. 22 and seen in the direction indicated by arrows.

This embodiment is a structural modification of the first embodiment and, more specifically, comprises a structural combination of the fourth and fifth embodiments. According to this embodiment, the n-type offset layer 133 having a resistance higher than that of the n-type high-resistance layer 112 is formed between the n-type drain layer 115 and the n-type high-resistance layer 112, and, on that portion of the surface of the n-type high-resistance layer 112 which lies between the p-type well layer 113 and the n-type offset layer 133, an n-type RESURF diffused layer 132 is formed.

According to this structure, the effects of the first, the fourth and fifth embodiments can be achieved all together. That is, the ON resistance can be decreased without increasing the element area, and further, the breakdown voltage of the element can be increased.

(Ninth Embodiment)

Figure 24:
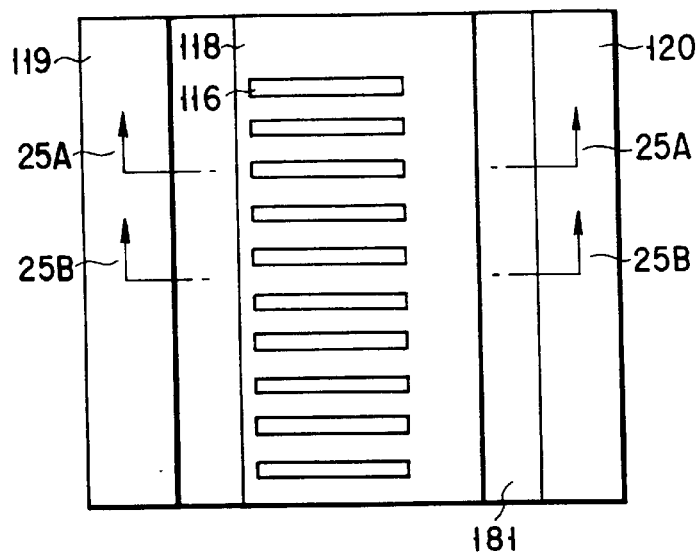
FIG. 24 is a plan view showing the structure of the lateral trench MOSFET according to a ninth embodiment of the present invention.
Figure 25A:
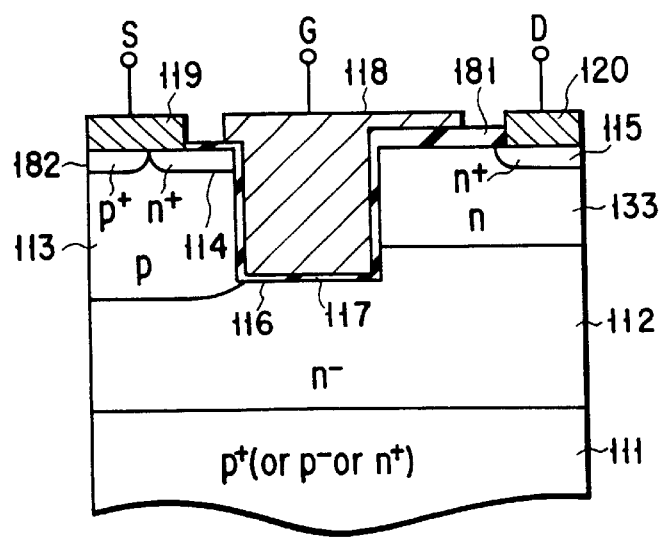
FIG. 25A is a sectional taken along the line 25A—25A in FIG. 24 and seen in the direction indicated by arrows.
Figure 25B:
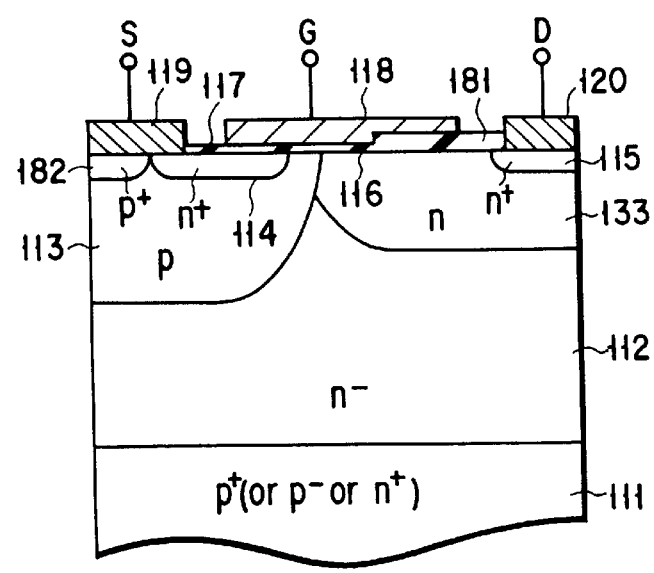
FIG. 25B is a sectional view taken along the line 25B—25B in FIG. 24 and seen in the direction indicated by arrows.

FIG. 24 is a plan view showing the structure of the lateral trench MOSFET according to a ninth embodiment of the present invention, FIG. 25A is a sectional view taken along the line 25A—25A in FIG. 24 and seen in the direction indicated by arrows, and FIG. 25B is a sectional view taken along the line 25B—25B in FIG. 24 and seen in the direction indicated by arrows.

This embodiment comprises a modified structure of the fifth embodiment, wherein the gate electrode 118 extends from within the respective trench 116 onto the surface of the n-type offset layer 133, and, between this n-type offset layer 133 and the gate electrode 118, there is formed an insulation film 181 which is thicker than the gate insulation film 117. This insulation film 181 is formed in such a manner that, before the formation of the trenches 116, a thick insulation film for the insulation film 181 is formed over the whole surface, and thereafter, the unnecessary portion of the thus formed insulation film is removed through the step of forming the trenches 116 or the like. Or the insulation film 181 is formed by a selective oxidation method such as LOCOS.

According to this structure, the accumulated electron layer induced on the surface of the n-type offset layer 133 when the gate is in ON state is thinned, and thus, the current ceases to concentrate on the surface, so that the amount of space charges (holes) canceled out by the electrons, in the n-type offset layer 133 is decreased. As a result, the intervals between the equipotential lines in the vicinity of the drain are widened, so that the drain breakdown voltage when the gate is turned on is improved.

Further, the insulation film 181 is thick, so that the electric field in the surface of the n-type offset layer 133 when in OFF state is weakened, and thus, the breakdown voltage is improved. Thus, it follows that, even if the lateral dimension of the n-type offset layer 133 is decreased in order to lower the ON resistance, the breakdown voltage when in OFF state is not deteriorated. Besides these, the same effects as those of the fifth embodiment can be obtained, too.

As a result of checking the characteristics of this element, it was found that, with respect to a breakdown voltage of 26V, a very excellent ON resistance value of 10.0 mΩm$^2$ was exhibited. Further, the breakdown voltage exhibited when the gate voltage was 5V was also an excellent value of 22V.

Further, in this embodiment, the n-type offset layer 133 is formed so as to be contacted with the p-type well layer 113 as shown in FIG. 25B, and in the surface of this p-type well layer 113, there is formed a p-type contact layer 182 having a high impurity concentration.

(Tenth Embodiment)

Figure 26:
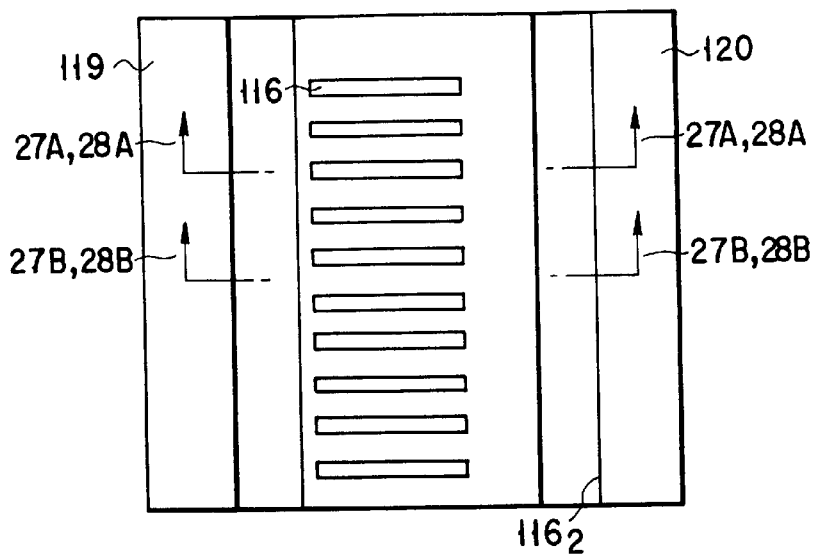
FIG. 26 is a plan view showing the structure of the lateral trench MOSFET according to a tenth embodiment of the present invention.
Figure 27A:
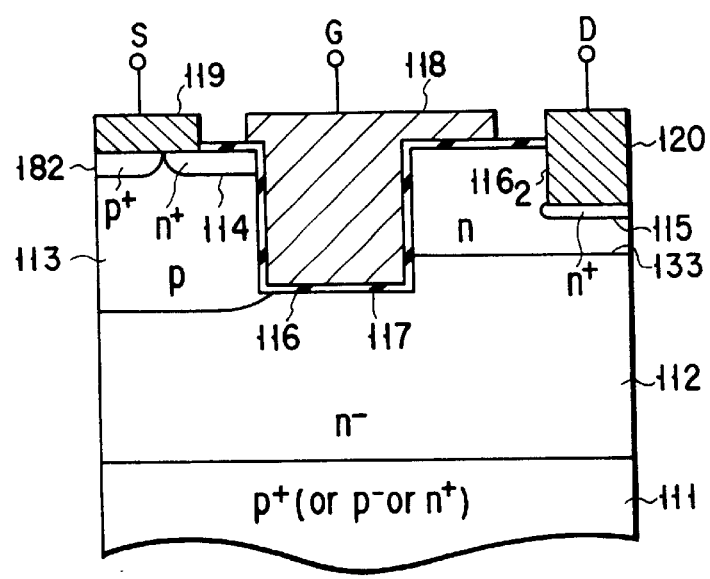
FIG. 27A is a sectional view taken along the line 27A—27A in FIG. 26 and seen in the direction indicated by arrows.
Figure 27B:
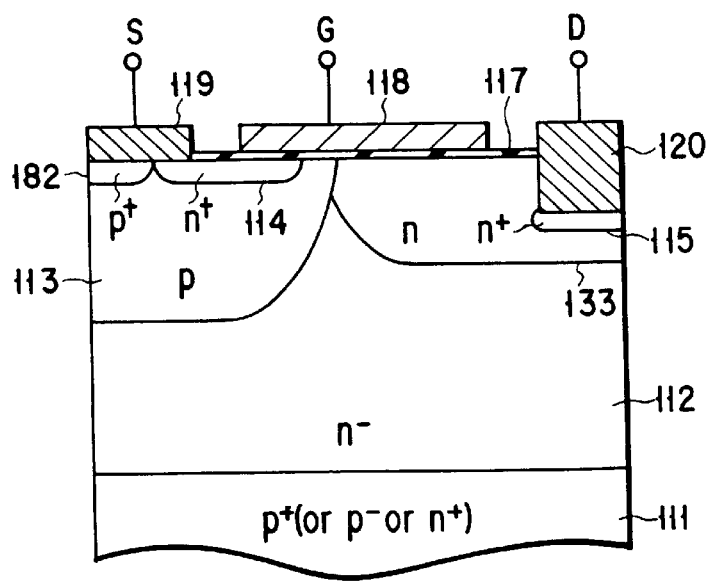
FIG. 27B is a sectional view taken the line 27B—27B in FIG. 26 and seen in the direction indicated by arrows.

FIG. 26 is a plan view showing the structure of the lateral trench MOSFET according to a tenth embodiment of the present invention, FIG. 27A is a sectional view taken along the line 27A—27A in FIG. 26 and seen in the direction indicated by arrows, and FIG. 27B is a sectional view taken along the line 27B—27B in FIG. 26 and seen in the direction indicated by arrows.

This embodiment comprises a modified structure of the fifth embodiment which is constituted in such a manner that, in the surface of the n-type offset layer 133, a trench 116$_2$ is formed in a state reaching an intermediate depth of the n-type offset layer 133, and on the surface of the n-type offset layer 133 which (surface) constitutes the bottom of this trench 116$_2$, an n-type drain layer 115 is formed, and within the trench 116$_2$, a drain electrode 120 is buried. In this case, the side surface of the trench 116$_2$ or the surface portions of the n-type offset layer 133 which constitutes the side surface and the bottom of the trench 116$_2$ may be formed by the n-type drain layer 115.

According to this structure, the ratio (second distance/first distance) of the distance (second distance) from the deepest portion of the trench 116$_2$ to the n-type drain layer 115 to the distance (first distance) from the shallowest portion of the trench 116$_2$ to the n-type drain layer 115 becomes smaller as compared with that in the case of the fifth embodiment.

In other words, the distance from the deepest portion of the trench 116$_2$ to the n-type offset layer 133 becomes shorter as compared with that in the case of the fifth embodiment. As a result, the resistance, in the n-type offset layer 133, to the electrons which pass through the deepest portion of the trench 116$_2$ becomes small, and thus, the ON resistance becomes low.

Further, according to this embodiment, current flows through the wide portion in which the drain electrode 120 is buried, so that the current which concentrates at the edge of the drain electrode 120 decreases as compared with that in the case of the fifth embodiment in which the drain electrode 120 is formed in the surface of the element, which also results in improving the drain breakdown voltage. Besides these, the same effects as those of the fifth embodiment can also be obtained.

Further, as a result of checking the characteristics of this element, there has been obtained the excellent result that, with respect to the breakdown voltage of 26V, the ON resistance was 12.0 mΩm$^2$. Further, the breakdown voltage exhibited when the gate voltage was 5V exhibited an excellent value of 28V.

(Eleventh Embodiment)

Figure 28A:
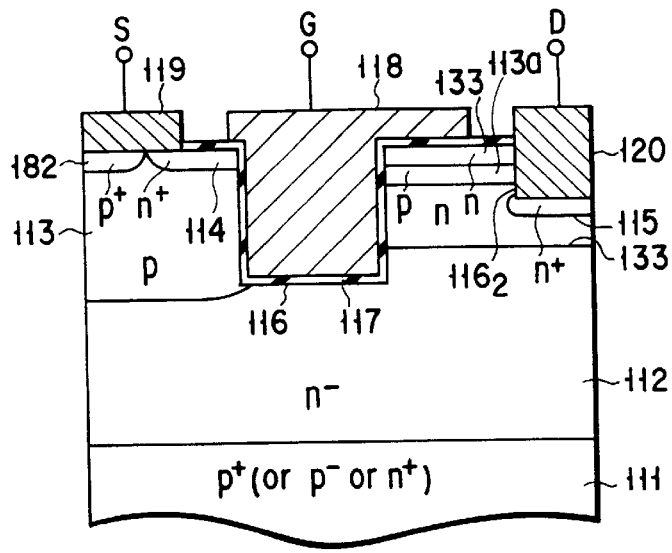
FIG. 28A is a sectional view taken along the line 28A—28A in FIG. 26 and seen in the direction indicated by arrows.
Figure 28B:
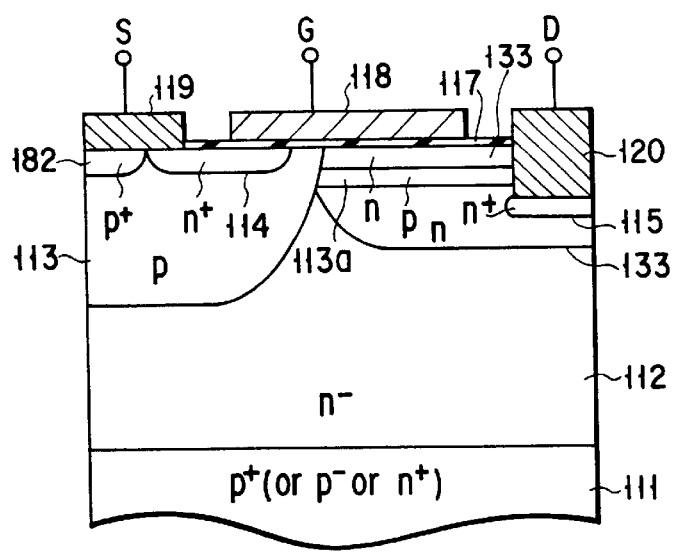
FIG. 28B is a sectional view taken the line 28B—28B in FIG. 26 and seen in the direction indicated by arrows.

Next, the lateral trench MOSFET according to an eleventh embodiment of the present invention will be described by reference to FIG. 28A and FIG. 28B. FIG. 28A is a sectional view taken along the line 28A—28A in FIG. 26 and seen in the direction indicated by arrows, and FIG. 28B is a sectional view taken along the line 28B—28B in FIG. 26 and seen in the direction indicated by arrows.

This embodiment differs from the tenth embodiment in that, in the former, at least one p-type layer 113a which is in contact with the p-type base layer 113 and the drain electrode 120 is formed in the n-type offset layer 133. Such p-type layers 113a can be formed in an optional number by epitaxially growing the p-type layers 113a and the n-type offset layers 133 by turns or by using high energy ion implantation.

In the case of this embodiment, the n-type offset layer 133 is depleted through the p-type layer 113a from the p-type layer 113, so that the distance over which the n-type offset layer 133 is depleted is shorter as compared with that in the case of tenth embodiment. Due to this, the impurity concentration of the n-type offset layer 133 can be enhanced.

(Twelfth Embodiment)

Figure 29:
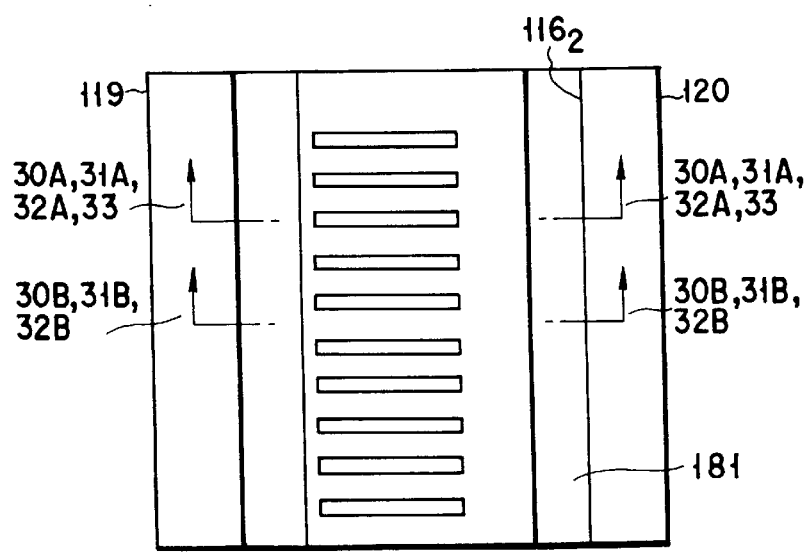
FIG. 29 is a plan view showing the structure of the lateral trench MOSFET according to a twelfth embodiment of the present invention.
Figure 30A:
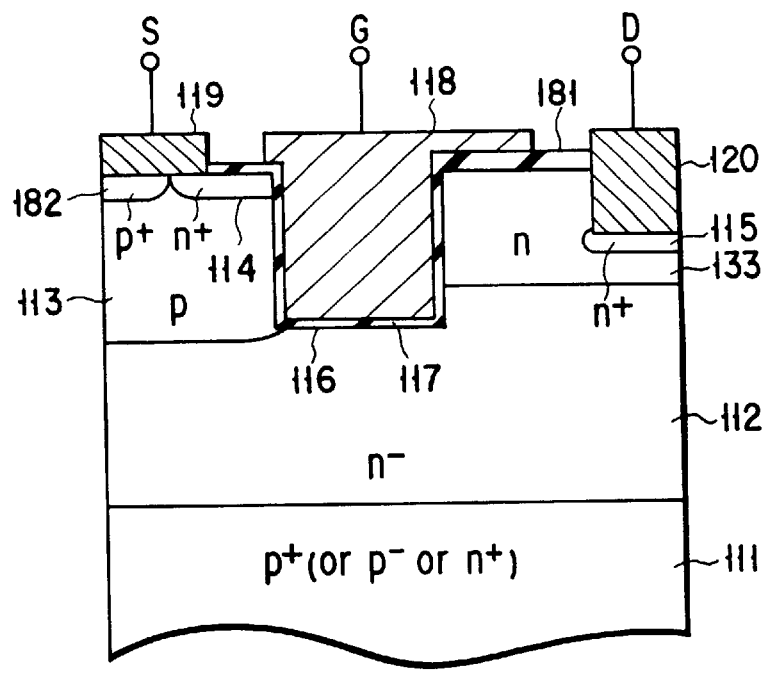
FIG. 30A is a sectional view taken along the line 30A—30A in FIG. 29 and seen in the direction indicated by arrows.
Figure 30B:
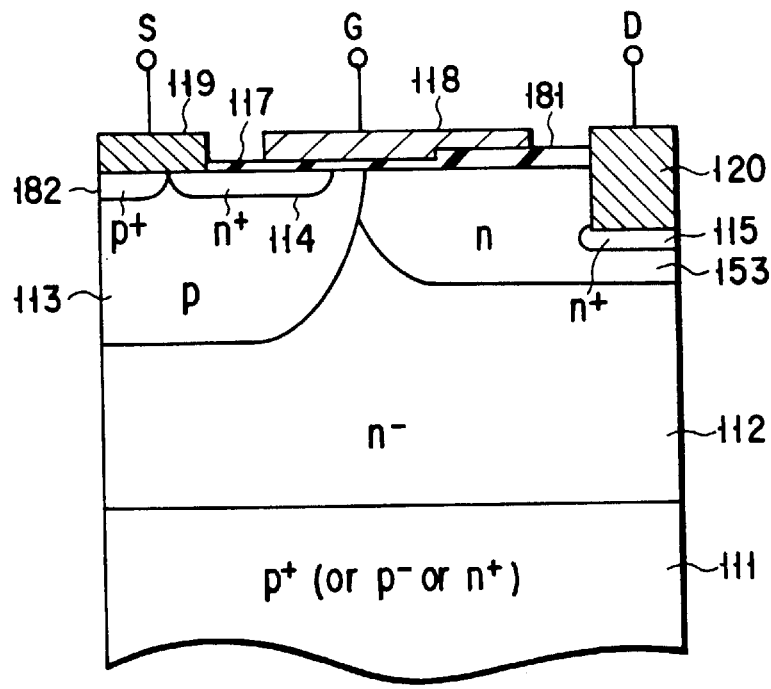
FIG. 30B is a sectional view taken the line 30B—30B in FIG. 29 and seen in the direction indicated by arrows.

FIG. 29 is a plan view showing the structure of the lateral trench MOSFET according to a twelfth embodiment of the present invention, FIG. 30A is a sectional view taken along the line 30A—30A in FIG. 29 and seen in the direction indicated by arrows, and FIG. 30B is a sectional view taken along the line 30B—30B in FIG. 29 and seen in the direction indicated by arrows.

This embodiment differs from the tenth embodiment in that, in the former, an insulation film 181 which is thicker than the gate insulation film 117 is formed between the n-type offset layer 133 and the gate electrode 118. That is, this embodiment comprises a combination of the ninth embodiment and the tenth embodiment.

As a result of checking the characteristics of this element, it was found that, with respect to the breakdown voltage of 25V, the ON resistance of this element assumed the very excellent value of 7.9 m$\Omega$m$^2$. Further, the breakdown voltage exhibited when the gate voltage was 5V was also an excellent value of 24V.

Figure 31A:
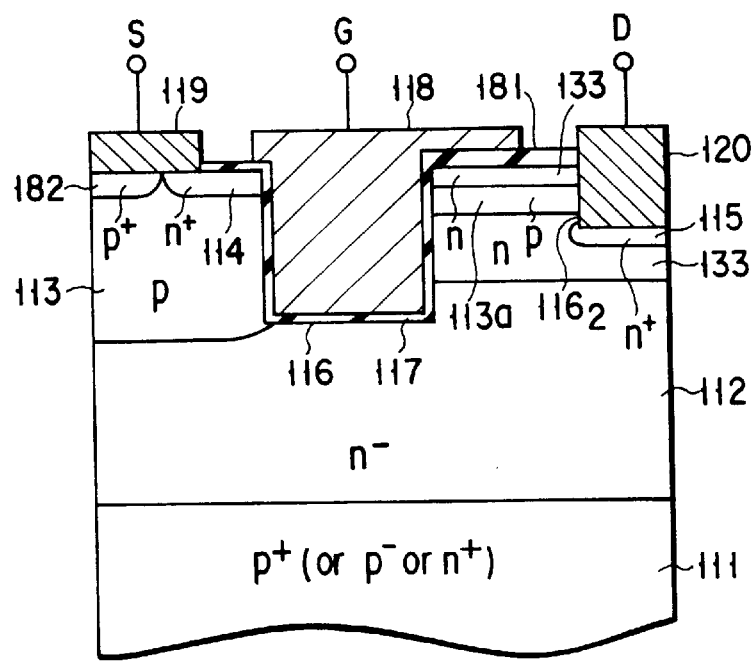
FIG. 31A is a sectional view taken along the line 31A—31A in FIG. 29 and seen in the direction indicated by arrows.
Figure 31B:
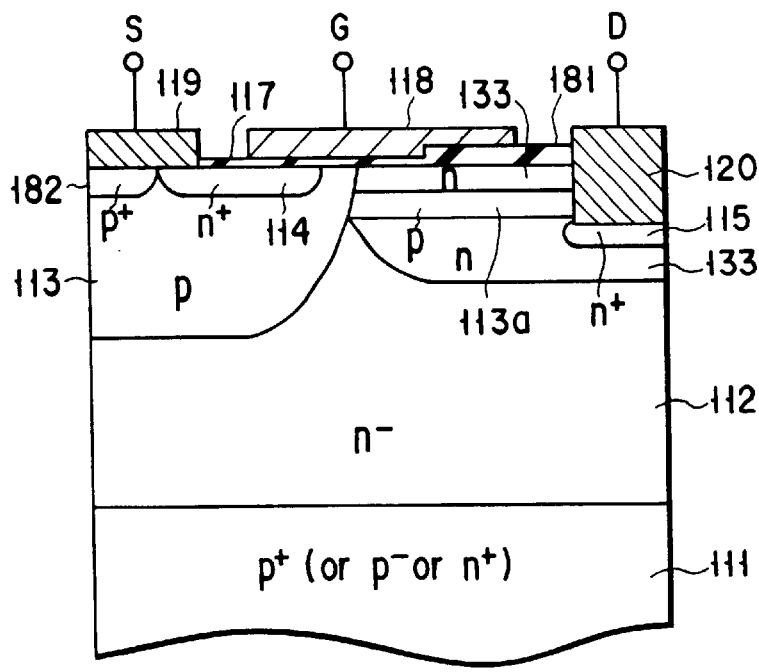
FIG. 31B is a sectional view taken the line 31B—31B in FIG. 29 and seen in the direction indicated by arrows.

Further, it is a matter of course that this embodiment may also be modified so as to comprise a combination of the ninth embodiment and the eleventh embodiment as shown in FIG. 31A and FIG. 31B.

Figure 32A:
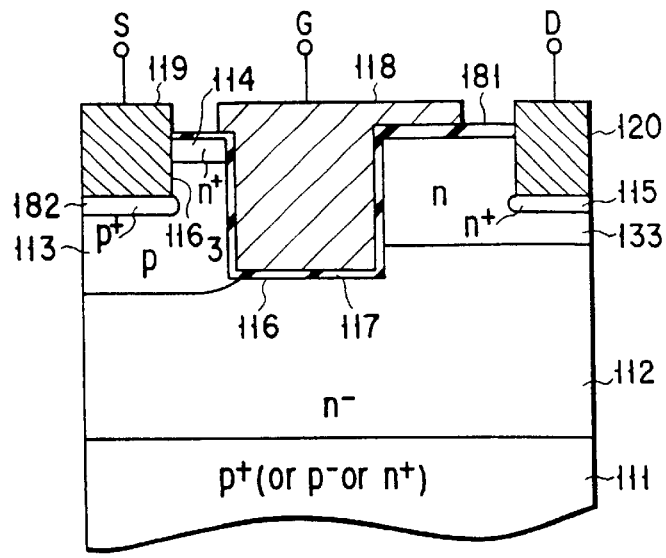
FIG. 32A is a sectional view taken along the line 32A—32A in FIG. 29 and seen in the direction indicated by arrows.
Figure 32B:
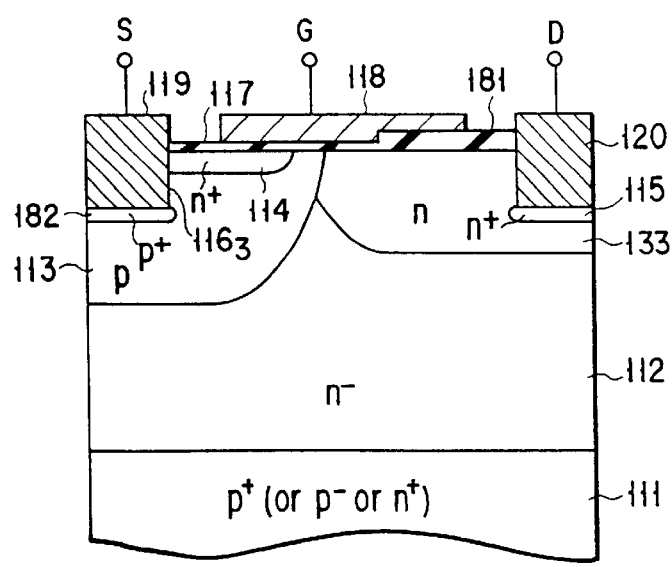
FIG. 32B is a sectional view taken the line 32B—32B in FIG. 29 and seen in the direction indicated by arrows.
Figure 33:
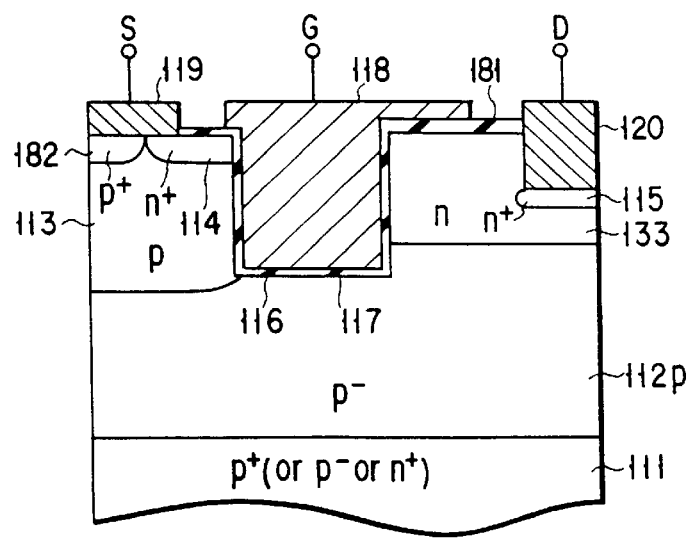
FIG. 33 is a sectional view taken along the line 33—33 in FIG. 29 and seen in the direction indicated by arrows.

This embodiment may further alternatively be constituted in such a manner that, as shown in FIG. 32A and FIG. 32B, a trench 116$_3$ is formed at the source side, and the source electrode 119 is formed in a state buried in the trench 116$_3$.

According to this structure, the current between the drain and source flows in a spread state, so that the SOA (safe operating area) can be enlarged.

Further, this embodiment can still alternatively be modified in such a manner that, in place of the n-type high-resistance layer 112, a p-type high-resistance layer 112p is provided by this modification, the same effects can also be obtained. This modification can be applied to the tenth and eleventh embodiments, too.

(Thirteenth Embodiment)

The structures described above are the basic structures of the present invention. Next, of the embodiments pertaining to the present invention, those which each have a source layer and a drain layer in a well layer will be described.

Figure 34:
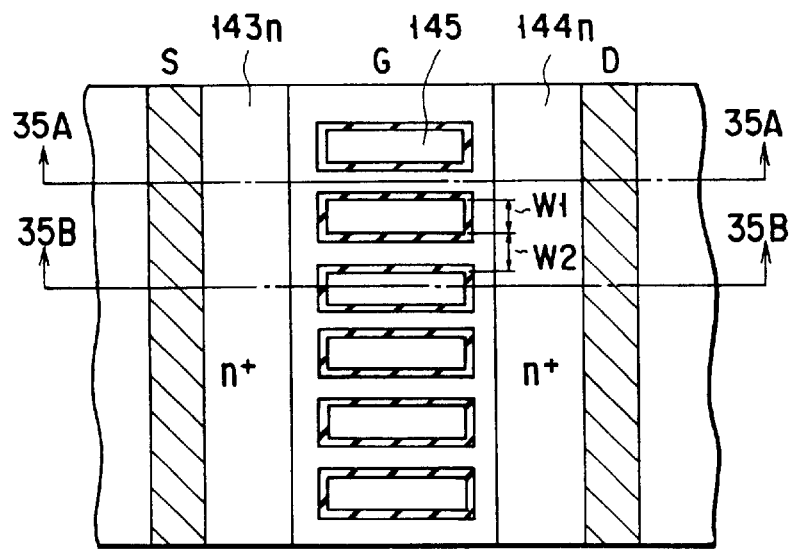
FIG. 34 is a plan view showing the structure of the lateral trench MOSFET according to a thirteenth embodiment of the present invention.
Figure 35A:
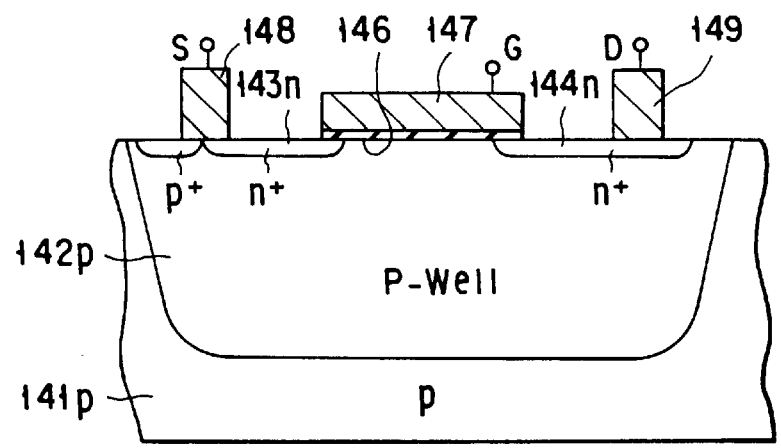
FIG. 35A is a sectional view taken along the line 35A—35A in FIG. 34 and seen in the direction indicated by arrows.
Figure 35B:
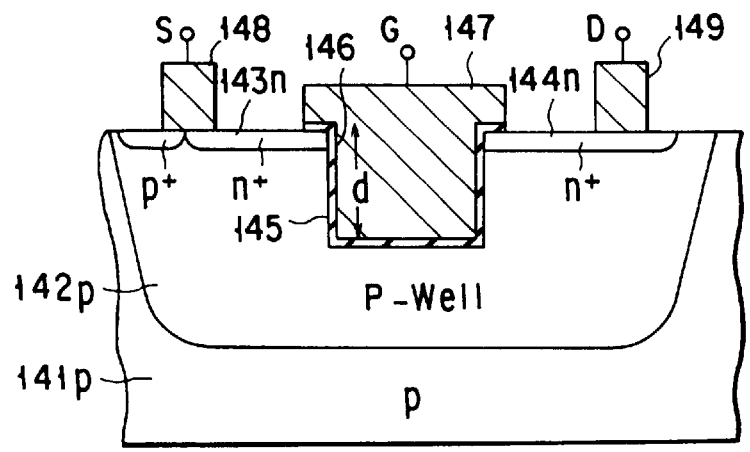
FIG. 35B is a sectional view taken along the line 35B—35B in FIG. 34 and seen in the direction indicated by arrows.

FIG. 34 is a plan view showing the structure of the lateral trench MOSFET according to a thirteenth embodiment of the present invention, FIG. 35A is a sectional view taken along the line 35A—35A in FIG. 34 and seen in the direction indicated by arrows, and FIG. 35B is a sectional view taken along the line 35B—35B in FIG. 34 and seen in the direction indicated by arrows.

This lateral trench MOSFET is constituted in such a manner that, on a p-type substrate 141p, a p-type well layer 142p is selectively formed. In the surface of the p-type well layer 141p, a stripe-shaped n-type source layer 143n is selectively formed, and, at a position apart from said n-type source layer 143n, a stripe-shaped n-type drain layer 144n is selectively formed so as to be parallel to the n-type source layer 143n.

In the intermediate region extending from the end of the n-type drain layer 144n to the p-type well layer 142p and the end of the n-type source layer 143n, a plurality of trenches 145 are formed in a state extending to an intermediate depth of the p-type well layer 142p. Further, the trenches 145 each have a stripe-like planar shape perpendicular to the n-type source layer 143n and the n-type drain layer 144n and are disposed approximately in parallel to one another.

Further, in the intermediate region between the drain and source and in the respective trenches 145, gate electrodes 147 are formed through gate insulation films 146. On the n-type source layer 143, a source electrode 148 is formed. On the n-type drain layer 144n, a drain electrode 149 is formed.

According to this constitution, if a voltage which is more positive than the source voltage is applied to the gate electrodes 147 when a positive voltage is applied to the drain electrode 149, and a negative voltage is applied to the source electrode 148 as already mentioned, then the surface portion of the p-type well layer 142p which lies adjacent to the gate electrodes 147 is inverted into the n conductivity type, so that electrons flow from the n-type source layer 143 to the n-type drain layer 144n through the inversion layer. That is, the element is brought into conduction.

In this case, in the p-type well layer 142p, a channel is formed along the trenches 145, and thus, a current flows in a state spreading inside as already mentioned. Thus, in accordance with the width of the channel within the p-type well layer 142p, the ON resistance can be decreased.

Here, if it is assumed that the width of each trench 145 is W1, the interval between the respective trenches 145 is W2, and the depth of the trenches is d, then the channel width per unit area can be increased to (W1+W2+2d)/(W1+W2) times as large as that of the conventional device.

Figure 36:
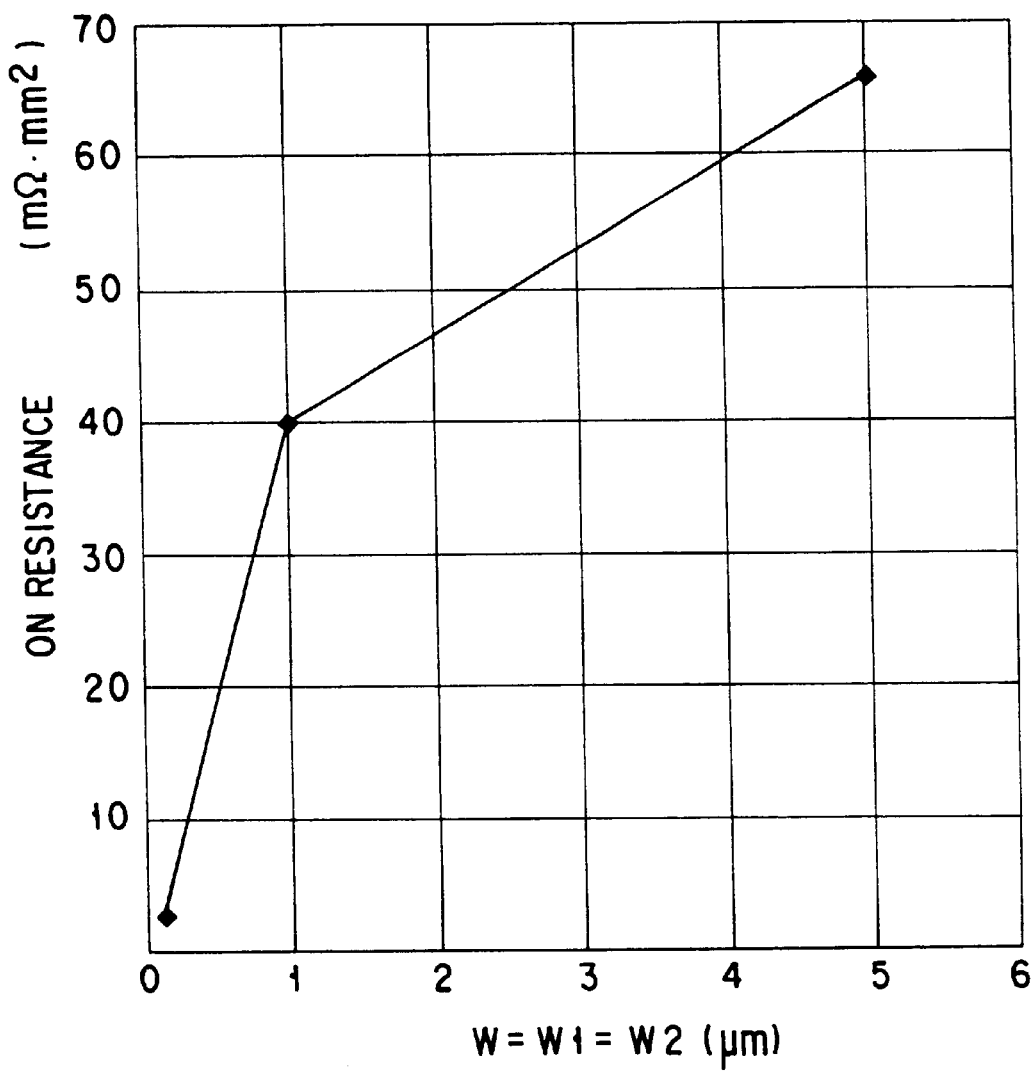
FIG. 36 is schematic diagram showing the relationship between the ON resistance and the trench size in the same embodiment.

FIG. 36 shows the relationship between the ON resistance and W when, for instance, W1=W2=W, and the depth d=1 $\mu$m. If W becomes narrower as shown, the channel width per unit area increases, so that the ON resistance is decreased. Further, in case W2 is 0.6 $\mu$m or below, the portion sandwiched between the trenches 145 becomes perfectly depleted, so that the electric field in the direction perpendicular to the channel is gone, and the decrease of the ON resistance becomes conspicuous. However, when W2 is below 0.03 $\mu$m, the effect of the scattering by the irregularities of the surface is increased, the ON resistance ceases to decrease. Further, in case W2 is narrower than 0.01 $\mu$m, the ON resistance is increased. Thus, it is desirable for W2 to lie within the range of 0.01 to 0.8 $\mu$m as already mentioned.

As described above, according to this embodiment, the n-type source layer 143n and the n-type drain layer 144n are provided in the p-type well layer 142p, but the same effects as those of the first embodiment can also be obtained.

(Fourteenth Embodiment)

Figure 37:
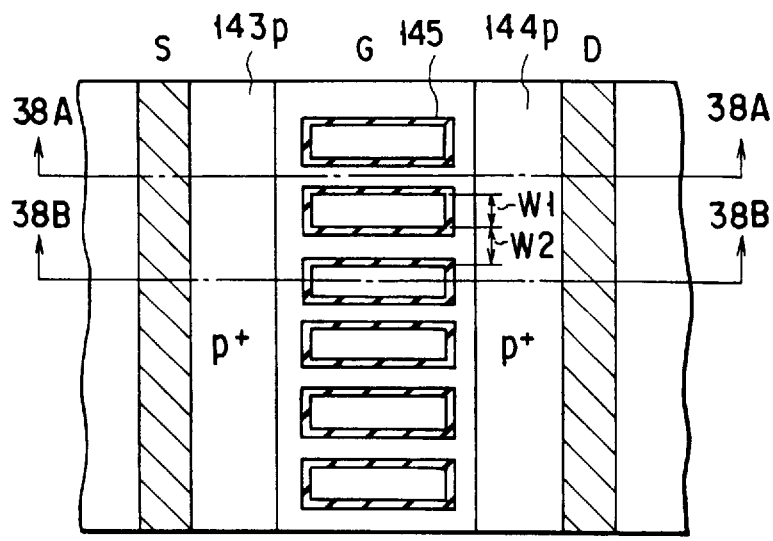
FIG. 37 is a plan view showing the structure of the lateral trench MOSFET according to a fourteenth embodiment of the present invention.
Figure 38A:
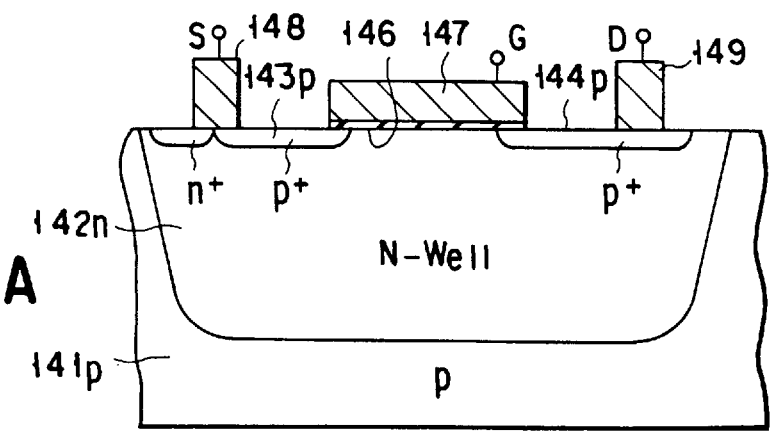
FIG. 38A is a sectional view taken along the line 38A—38A in FIG. 37 and seen in the direction indicated by arrows.
Figure 38B:
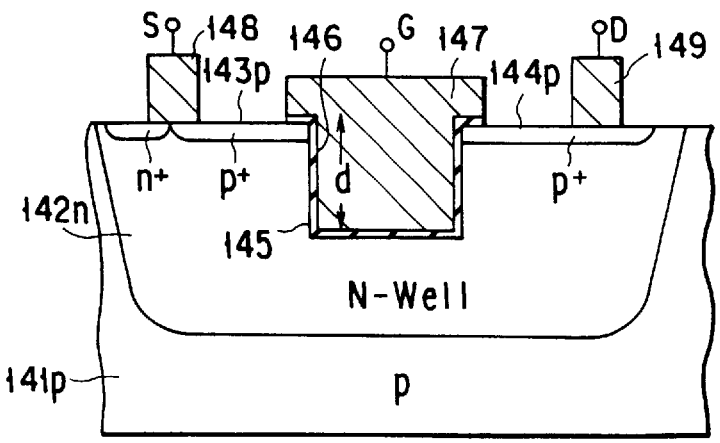
FIG. 38B is a sectional view taken along the line 38B—38B in FIG. 37 and seen in the direction indicated by arrows.

FIG. 37 is a plan view showing the structure of the lateral trench MOSFET according to the fourteenth embodiment of the present invention, FIG. 38A is a sectional view taken along the line 38A—38A in FIG. 37 and seen in the direction indicated by arrows, and FIG. 38B is a sectional view taken along the line 38B—38B in FIG. 37 and seen in the direction indicated by arrows.

This embodiment is a structural modification of the thirteenth embodiment; that is, this embodiment is constituted in such a manner that the conductivity types of the p-type well layer 142p, the n-type source layer 143n and the n-type drain layer 144n in the nineteenth embodiment are inverted; and more specifically, in this embodiment, an n-type well layer 142n, a p-type source layer 143p, and a p-type drain layer 144p are provided in place of the p-type well layer 142p, the n-type source layer 143n and the n-type drain layer 144n, respectively.

This embodiment, which is constituted as described above, can also achieve the same effects as those of the thirteenth embodiment. Further, this embodiment, coupled with the thirteenth embodiment, can constitute a bridge circuit or a push-pull circuit.

(Fifteenth Embodiment)

Figure 39:
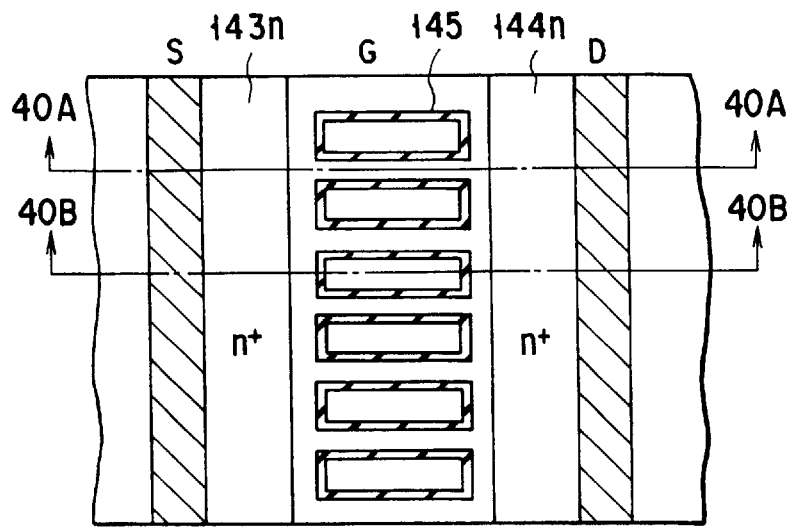
FIG. 39 is a plan view showing the structure of the lateral trench MOSFET according to a fifteenth embodiment of the present invention.
Figure 40A:
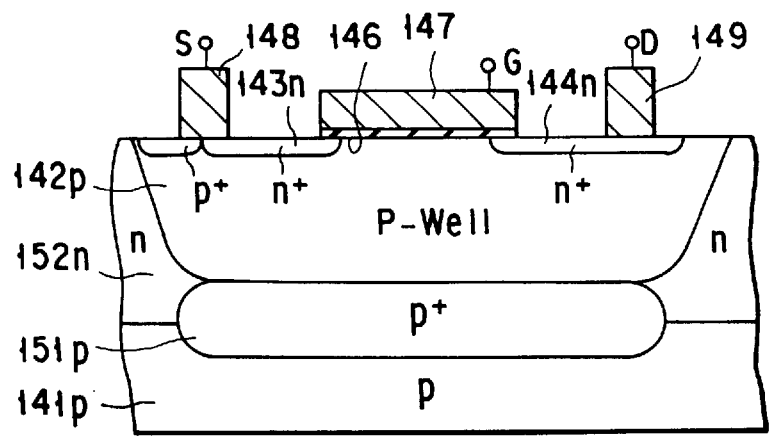
FIG. 40A is a sectional view taken along the line 40A—40A in FIG. 39 and seen in the direction indicated by arrows.
Figure 40B:
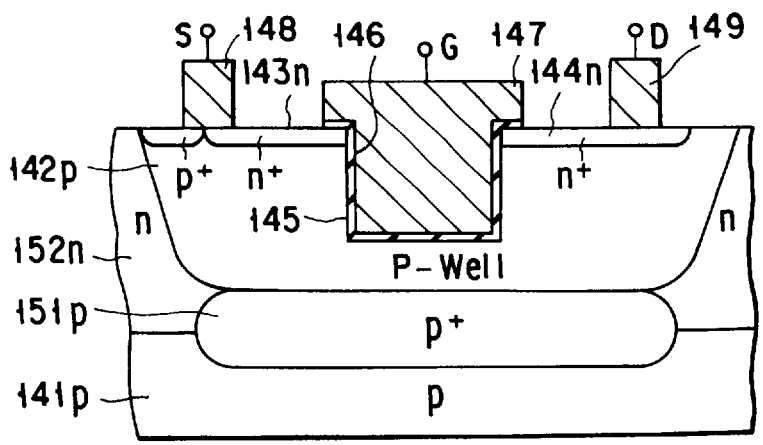
FIG. 40B is a sectional view taken along the line 40B—40B in FIG. 39 and seen in the direction indicated by arrows.

FIG. 39 is a plan view showing the structure of the lateral trench MOSFET according to a fifteenth embodiment of the present invention, FIG. 40A is a sectional view taken along the line 40A—40A in FIG. 39 and seen in the direction indicated by arrows, and FIG. 40B is a sectional view taken along the line 40B—40B in FIG. 39 and seen in the direction indicated by arrows.

This embodiment is a structural modification of the thirteenth embodiment; in this embodiment, the structure of the region adjacent to the p-type well layer in the nineteenth embodiment is modified. More specifically, this embodiment is constituted in such a manner that, in the surface of the p-type substrate, a low-resistance p-type buried layer 151p is formed; on this p-type buried layer 151p, an n-type epitaxial layer 152n is formed; and, in the surface of the n-type epitaxial layer 152n, the p-type well layer 142p is formed so as to reach the p-type buried layer 151p. The structure within the p-type well layer 142p is the same as that of the thirteenth embodiment.

According to this structure, the same effects as those of the thirteenth embodiment can also be achieved.

(Sixteenth Embodiment)

Figure 41:
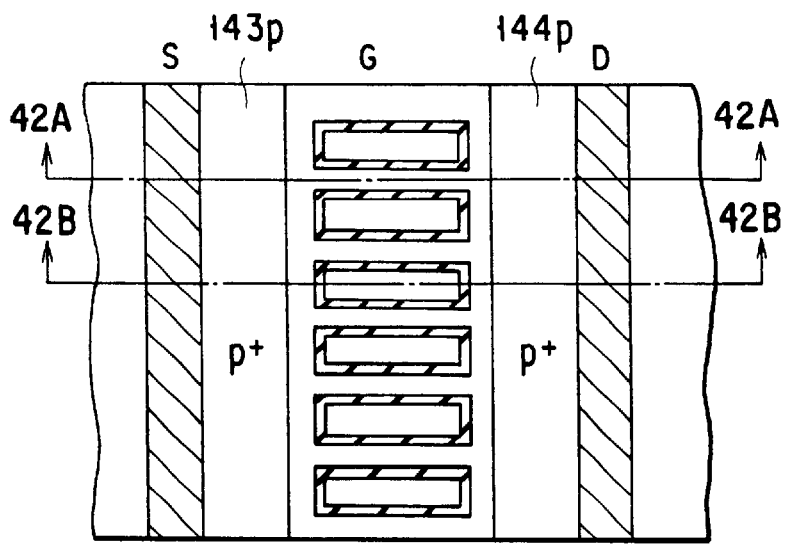
FIG. 41 is a plan view showing the structure of the lateral trench MOSFET according to a sixteenth embodiment of the present invention.
Figure 42A:
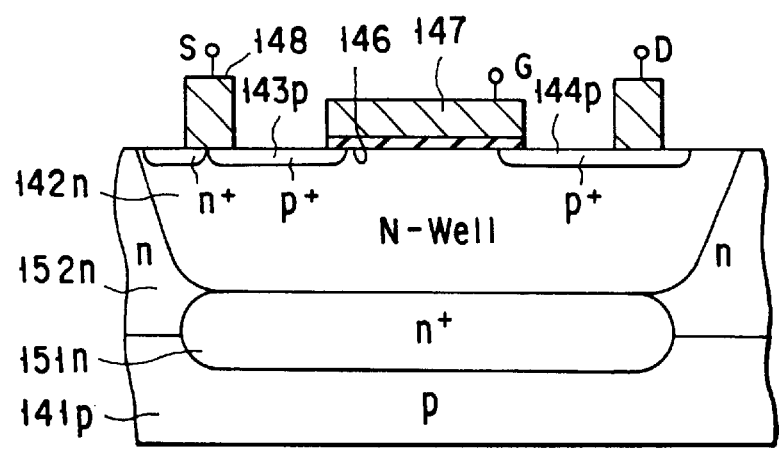
FIG. 42A is a sectional view taken along the line 42A—42A in FIG. 41 and seen in the direction indicated by arrows.
Figure 42B:
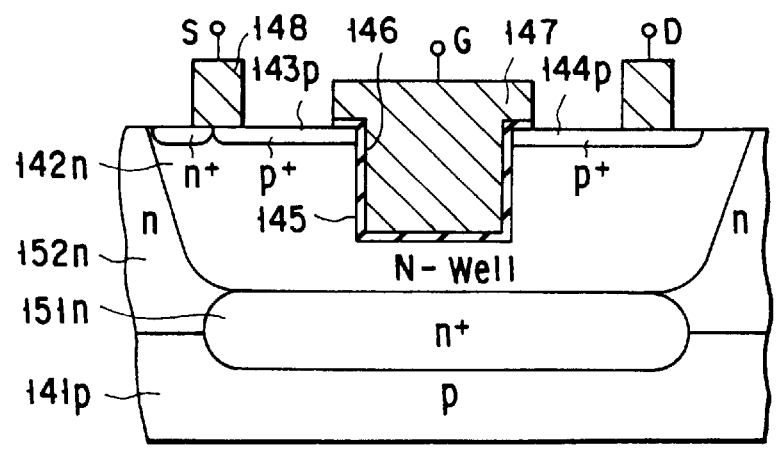
FIG. 42B is a sectional view taken along the line 42B—42B in FIG. 41 and seen in the direction indicated by arrows.

FIG. 41 is a plan view showing the structure of the lateral trench MOSFET according to a sixteenth embodiment of the present invention, FIG. 42A is a sectional view taken along the line 42A—42A in FIG. 41 and seen in the direction indicated by arrows, and FIG. 42B is a sectional view taken along the line 42B—42B in FIG. 41 and seen in the direction indicated by arrows.

This embodiment is a structural modification of the fifteenth embodiment; that is, this embodiment is constituted in such a manner that the conductivity types of the p-type buried layer 151p, the p-type well layer 142p, the n-type source layer 143n and the n-type drain layer 144n in the twenty-first embodiment are inverted, respectively. More specifically, in this embodiment, an n-type buried layer 151n, an n-type well layer 142n, a p-type source layer 143p and a p-type drain layer 144p are provided in place of the p-type buried layer 151p, the p-type well layer 142p, the n-type source layer 144n and the n-type drain layer 144n in the twenty-first embodiment.

According to this structure, the same effects as those of the fifteenth embodiment can also be achieved. Further, this embodiment, coupled with the fifteenth embodiment, can constitute a bridge circuit or a push-pull circuit.

(Seventeenth Embodiment)

Figure 43:
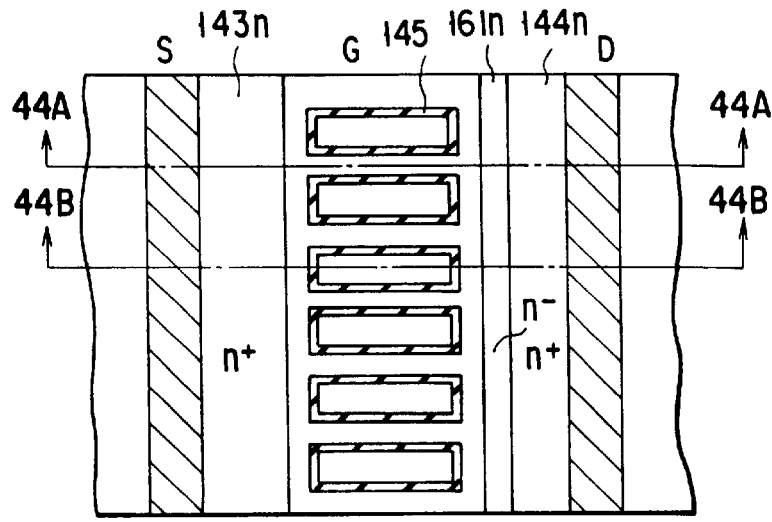
FIG. 43 is a plan view showing the structure of the lateral trench MOSFET according to a seventeenth embodiment of the present invention.
Figure 44A:
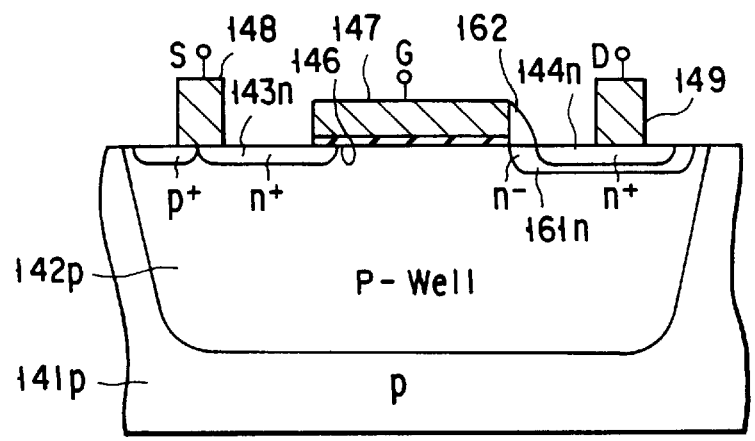
FIG. 44A is a sectional view taken along the line 44A—44A in FIG. 43 and seen in the direction indicated by arrows.
Figure 44B:
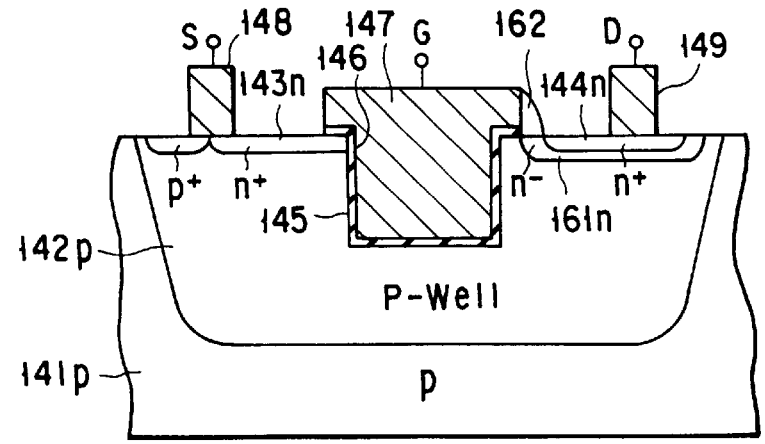
FIG. 44B is a sectional view taken along the line 44B—44B in FIG. 43 and seen in the direction indicated by arrows.

FIG. 43 is a plan view showing the structure of the lateral trench MOSFET according to a seventeenth embodiment of the present invention, FIG. 44A is a sectional view taken along the line 44A—44A in FIG. 43 and seen in the direction indicated by arrows, and FIG. 44B is a sectional view taken along the line 44B—44B in FIG. 43 and seen in the direction indicated by arrows.

This embodiment is a structural modification of the thirteenth embodiment; more specifically, this embodiment is constituted in such a manner that, between the n-type drain layer 144n and the p-type well layer 142p, there is provided an n-type offset layer 161n having a resistance higher than that of the n-type drain layer 144n.

Here, the n-type offset layer 161n can be formed in self-aligning manner by the use of the gate electrode 147 as a mask. Further, the n-type drain layer 144n can be formed in such a manner that, for instance, after the formation of the n-type offset layer 161n, an oxide film is formed at least on the gate electrodes 147 and the n-type offset layer 161, and then, the oxide film is removed by the use of RIE to form side walls 162—comprising the oxide film—for the gate electrodes 147; and further, by the use, as a mask, of the gate electrode 147 and the side wall 162 thereof, said n-type drain layer 144n can be formed in self-aligning manner by diffusion.

According to this structure, the same effects as those of the thirteenth embodiment can also be achieved. Further, in the case of this embodiment, it is ensured that, even if the gate insulation film 146 becomes thin, and the p-type well layer 142p becomes highly concentrated as compared with the thirteenth embodiment, the electric field at the end of the drain under the gate can be relaxed, so that the breakdown voltage can be maintained.

(Eighteenth Embodiment)

Figure 45:
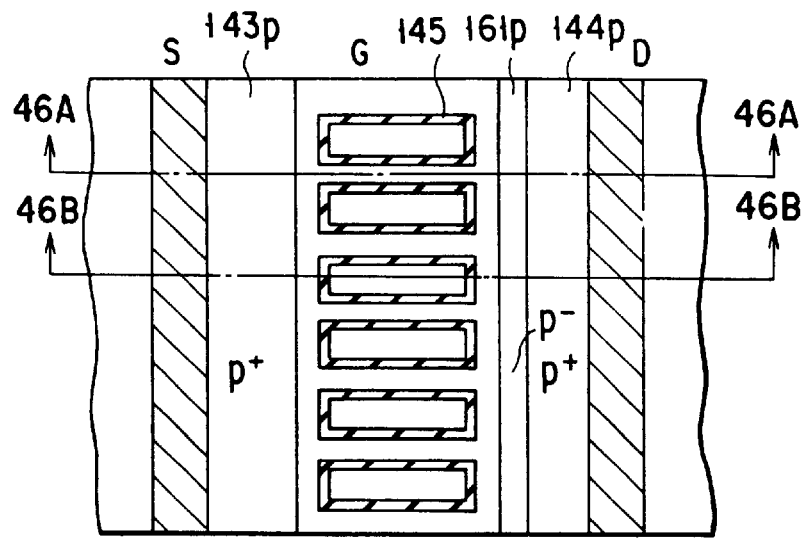
FIG. 45 is a plan view showing the structure of the lateral trench MOSFET according to an eighteenth embodiment of the present invention.
Figure 46A:
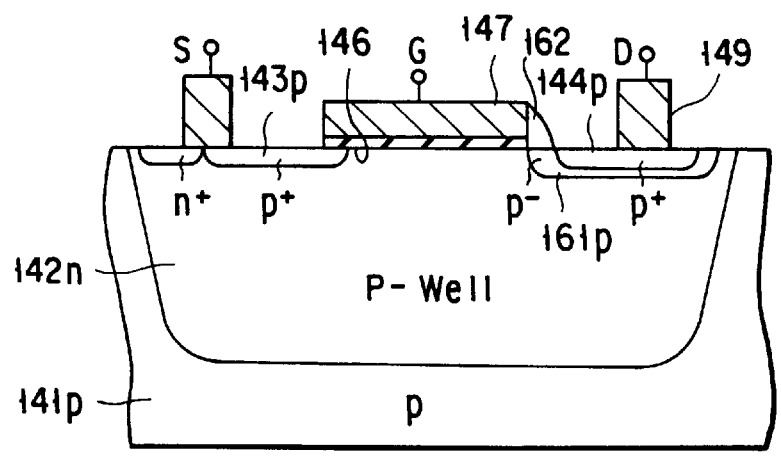
FIG. 46A is a sectional view taken along the line 46A—46A in FIG. 45 and seen in the direction indicated by arrows.
Figure 46B:
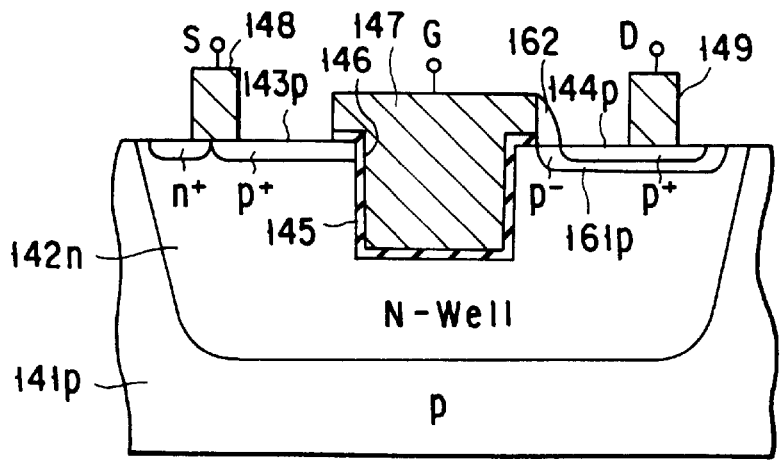
FIG. 46B is a sectional view taken along the line 46B—46B in FIG. 45 and seen in the direction indicated by arrows.

FIG. 45 is a plan view showing the structure of the lateral trench MOSFET according to an eighteenth embodiment of the present invention, FIG. 46A is a sectional view taken along the line 46A—46A in FIG. 45 and seen in the direction indicated by arrows, and FIG. 46B is a sectional view taken along the line 46B—46B in FIG. 45 and seen in the direction indicated by arrows.

This embodiment is a structural modification of the seventeenth embodiment. This embodiment is constituted in such a manner that the conductivity types of the p-type well layer 142p, the n-type source layer 143n, the n-type offset layer 161n and the n-type drain layer 144n in the twenty-third embodiment are inverted. More specifically, in this embodiment, an n-type well layer 142n, a p-type source layer 143p, a p-type offset layer 161p and a p-type drain layer 1441p are provided in place of the p-type well layer 142p, the n-type source layer 143n, the n-type offset layer 161n and the n-type drain layer 144n.

According to this structure, the same effects as those of the seventeenth embodiment can also be achieved. Further, this embodiment, coupled with the seventeenth embodiment, can constitute a bridge circuit or a push-pull circuit.

(Nineteenth Embodiment)

Figure 47:
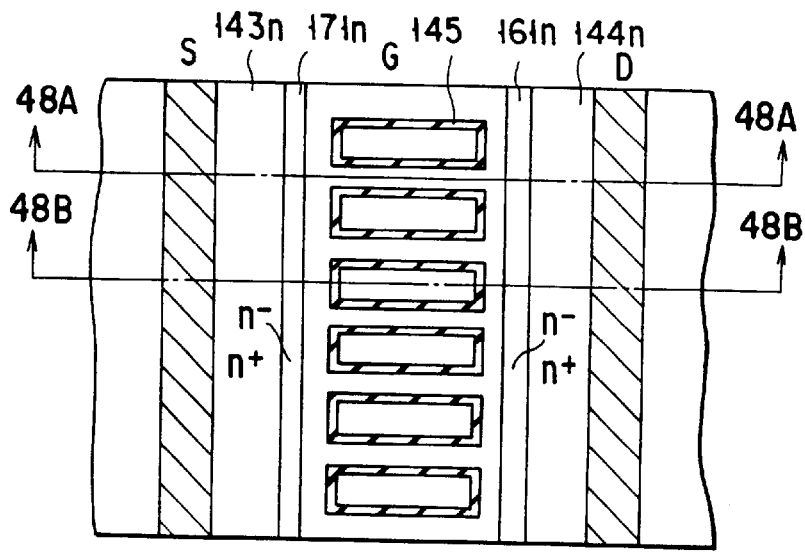
FIG. 47 is a plan view showing the structure of the lateral trench MOSFET according to a nineteenth embodiment of the present invention.
Figure 48A:
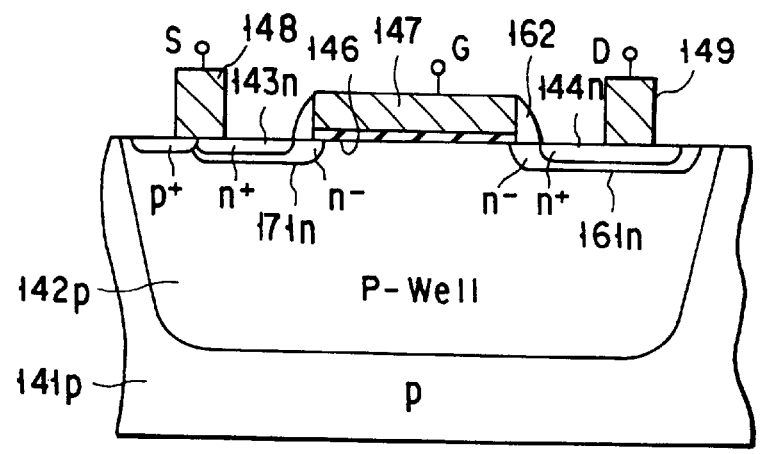
FIG. 48A is a sectional view taken along the line 48A—48A in FIG. 47 and seen in the direction indicated by arrows.
Figure 48B:
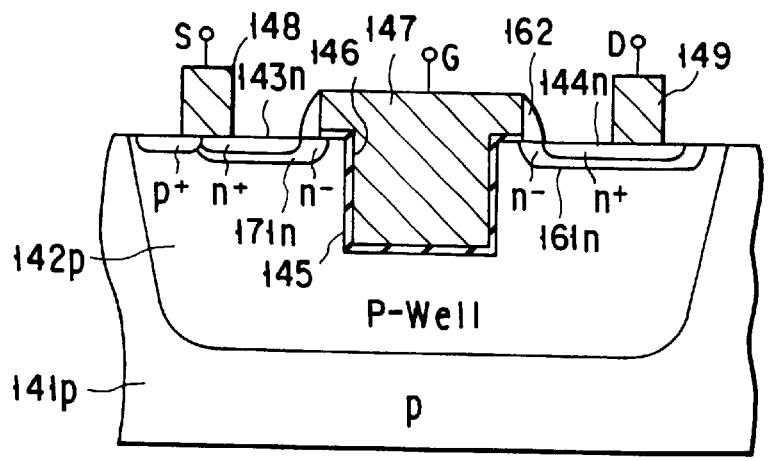
FIG. 48B is a sectional view taken along the line 48B—48B in FIG. 47 and seen in the direction indicated by arrows.

FIG. 47 is a plan view showing the structure of the lateral trench MOSFET according to a nineteenth embodiment of the present invention, FIG. 48A is a sectional view taken along the line 48A—48A in FIG. 47, and FIG. 48B is a sectional view taken along the line 48B—48B in FIG. 47 and seen in the direction indicated by arrows.

This embodiment is a structural modification of the seventeenth embodiment. More specifically, this embodiment is constituted in such a manner that, between the n-type source layer 143n and the p-type well layer 142p, there is provided an n-type low-concentration layer 171n which has a resistance higher than the resistance of the n-type source layer 143n.

Here, the n-type low-concentration layer 171n is formed, simultaneously with the formation of the afore-said n-type offset layer 161n, by the use of manufacturing steps similar to those for the above-mentioned n-type offset layer 161n. Further, similarly, the n-type source layer 143n is formed simultaneously with the formation of the afore-said n-type drain layer 144n, by the use of manufacturing steps similar to those for the n-type drain layer 144n.

According to this structure, the same effects as those of the seventeenth embodiment can also be achieved. Further, In the case of this embodiment, the n-type source layer 143n and the n-type drain layer 144n can be formed at the same time, so that the number of manufacturing steps can be reduced.

(Twentieth Embodiment)

Figure 49:
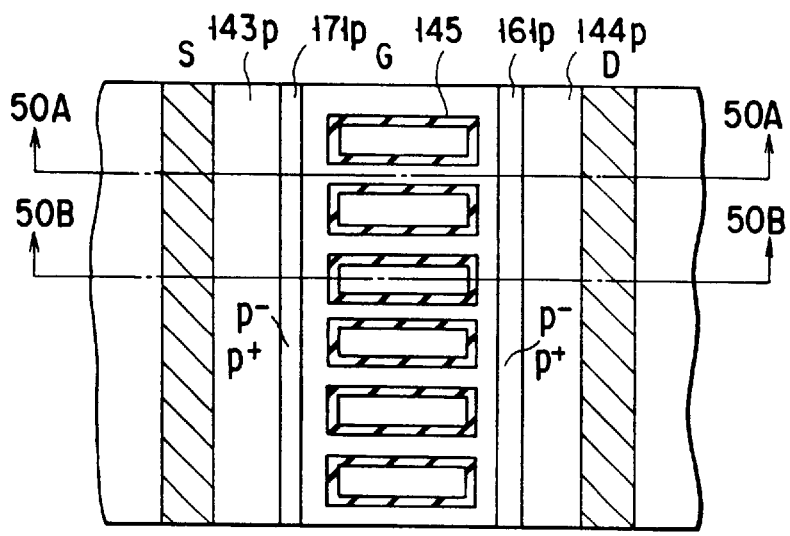
FIG. 49 is a plan view showing the structure of the lateral trench MOSFET according to a twentieth embodiment of the present invention.
Figure 50A:
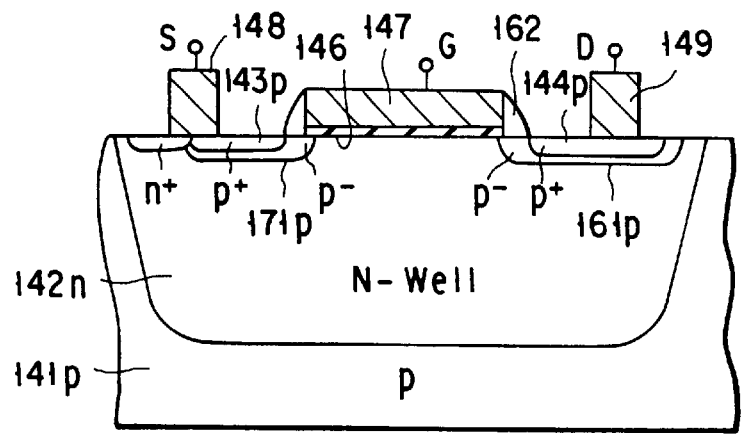
FIG. 50A is a sectional view taken along the line 50A—50A in FIG. 49 and seen in the direction indicated by arrows.
Figure 50B:
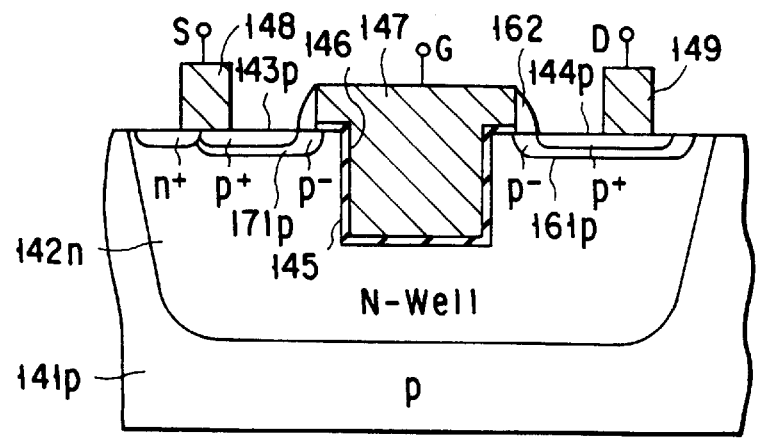
FIG. 50B is a sectional view taken along the line 50B—50B in the FIG. 49 and seen in the direction indicated by arrows.

FIG. 49 is a plan view showing the structure of the lateral trench MOSFET according to the twentieth embodiment of the present invention, FIG. 50A is a sectional view taken along the line 50A—50A in FIG. 49 and seen in the direction indicated by arrows and seen in the direction indicated by arrows, and FIG. 50B is a sectional view taken along the line 50B—50B in FIG. 49 and seen in the direction indicated by arrows.

This embodiment is a structural embodiment of the nineteenth embodiment. This embodiment is constituted in such a manner that the conductivity types of the p-type well layer 142p, the n-type source layer 143n, the n-type low-concentration layer 171n, the n-type offset layer 161n and the n-type drain layer 144n are inverted. More specifically, in this embodiment, an n-type well layer 142n, a p-type source layer 143p, a p-type low-concentration layer 171p, a p-type offset layer 161p and a p-type drain layer 144p are provided in place of the p-type well layer 142p, the n-type source layer 143n, the n-type low-concentration layer 171n, the n-type offset layer 161n and the n-type drain layer 144n in the nineteenth embodiment.

According to this structure, the same effects as those of the nineteenth embodiment can also be achieved. Further, this embodiment, coupled with the nineteenth embodiment, can constitute a bridge circuit or a push-pull circuit.

(Twenty-first Embodiment)

Figure 51:
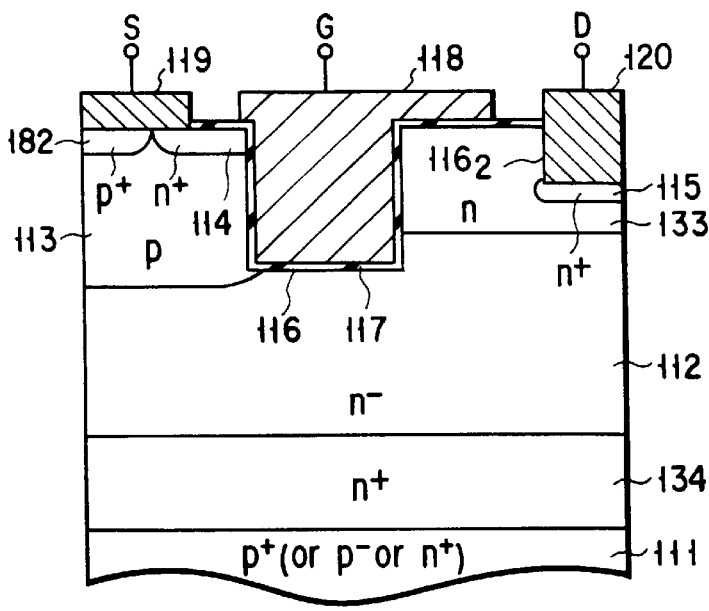
FIG. 51 is a sectional view showing the structure of the lateral trench MOSFET according to a twenty-first embodiment of the present invention.

FIG. 51 is a sectional view showing the structure of the lateral trench MOSFET according to a twenty-first embodiment of the present invention, this sectional view corresponding to FIG. 27A.

The feature of this embodiment lies in the point that, in the element shown in FIG. 26, FIG. 27A and FIG. 27B, an n-type low-resistance buried layer 134 is formed between the p-type substrate 111 and the n-type high-resistance layer 112.

According to this structure, the flow path along which the main current flows when the gate is turned on (conducts) spreads in the vertical direction, so that the ON resistance can be lowered as compared with the element shown in FIG. 26, FIG. 27A and FIG. 27B.

Figure 52:
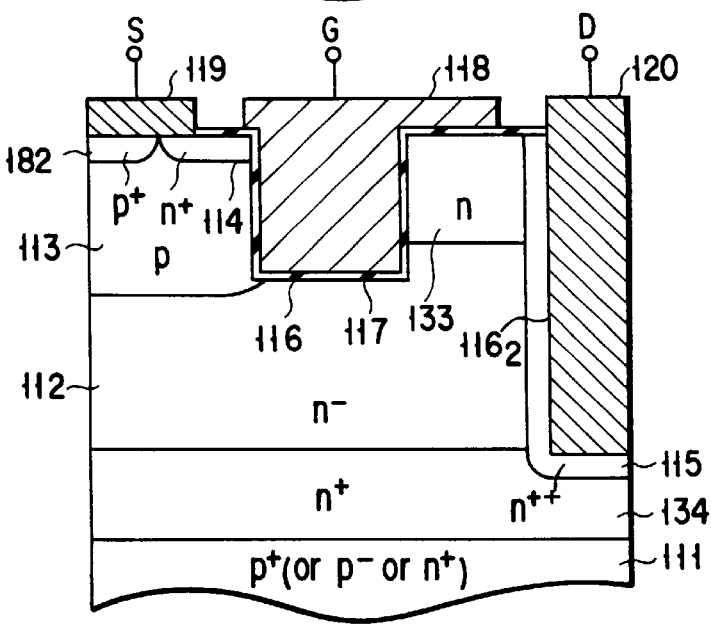
FIG. 52 is a sectional view showing the structure of a structural modification of the same embodiment.

FIG. 52 shows a modification of this embodiment, which is constituted in such a manner that the drain electrode 120 is formed extending as far as the n-type buried layer 134 in this case the ON resistance can be further lowered.

(Twenty-second Embodiment)

FIG. 53 is a sectional view showing the structure of the lateral trench MOSFET and bipolar transistor according to a twenty-second embodiment of the present invention, this sectional view corresponding to FIG. 27A.

A first feature of this embodiment lies in the point that the n-type buried layer of the lateral MOSFET and the n-type buried layer of the bipolar transistor are n-type buried layers 134 which have the same impurity concentration profile.

According to this structure, the n-type buried layer of the lateral MOSFET and the n-type buried layer of the bipolar transistor can be formed by one and the same manufacturing step, so that the number of manufacturing steps can be reduced.

A second feature of this embodiment lies in the point that a collector electrode 188 is formed in a state buried in a trench extending as far as the n-type buried layer 134.

According to this structure, the collector resistance is reduced, and thus, a bipolar transistor with excellent characteristics can be obtained. Further, since the collector electrode 188 and the drain electrode 115 can be formed by one and the same manufacturing step, whereby the number of manufacturing steps can be reduced again.

In FIG. 53, the reference numeral 183 denotes a p-type diffused layer, and numeral 184 denotes a p-type diffused layer having an impurity concentration higher than that of the p-type diffused layer 183, these p-type diffused layers 183 and 184 constitute a pn junction isolation together with an n-type high-resistance layer 112. Further, numeral 185 denotes a p-type base layer, numeral 186 denotes a p-type contact layer thereof, numeral 187 denotes an n-type emitter layer, numeral 188 denotes a collector electrode, numeral 189 denotes a base electrode, and numeral 190 denotes an emitter electrode.

For instance, in the foregoing embodiments, the p conductivity type is referred to as the first conductivity type, and the n conductivity type is referred to as the second conductivity type, but, in said embodiments, the conductivity types referred to can all be inverted.

Figure 54:
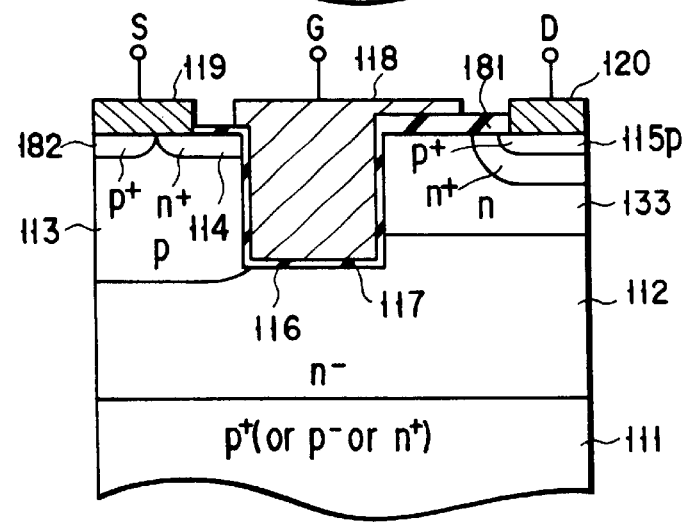
FIG. 54 is a schematic diagram used for explaining the fact that the present invention is applicable to IGBT.

Further, the present invention can be applied not only to lateral MOSFET but also to IGBT (Insulated Gate Bipolar Transistor) by alteration of the semiconductor layers at the drain electrode 120 side. For instance, the IGBT shown in FIG. 54 is a modification of the lateral MOSFET shown in FIG. 25A, which is constituted in such a manner that, in place of the n+ type drain layer 115, a p+ type emitter layer 115p is provided, and, between the p+ emitter layer 115p and the n-type high-resistance layer 112, an n+ type layer 115a is provided. By the use of similar modifying measures, the respective embodiments of the present invention can also be applied to IGBT.

Additional advantages and modifications will readily occurs to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A lateral semiconductor device comprising:

an active region;

a base region of a first conductivity type formed in said active region;

a source region of a second conductivity type formed in said base region;

a drain region formed in said active region and formed substantially deeper than said source region;

a buried electrode connected to said drain region;

a plurality of trenches formed between said source and drain regions, said trenches having sidewalls;

an insulation layer formed on a surface region of said active region including said plurality of trenches; and a gate electrode formed in said trenches and over a portion of said active region disposed between said trenches through said insulation layer;

said gate electrode having a portion formed over said active region and extended toward said drain region;

wherein a thickness of said insulation layer under said portion of said gate electrode is greater than a thickness of said insulation layer formed on said sidewalls of said trenches.

2. A lateral semiconductor device comprising:

an active region;

a base region of a first conductivity type formed in said active region;

a source region of a second conductivity type formed in said base region;

a drain region formed in said active region;

a plurality of trenches formed between said source and drain regions, said trenches having sidewalls;

an insulation layer formed on a surface region of said active region including said plurality of trenches;

a gate electrode formed in said trenches and over a portion of said active region disposed between said trenches through said insulation layer;

said gate electrode having a portion formed over said active region and extended toward said drain region; and a buried region of said second conductivity type formed in contact with said drain region and extending toward said base region;

wherein a thickness of said insulation layer under said portion of said gate electrode is greater than a thickness of said insulation layer formed on said sidewalls of said trenches.

3. A device as recited in claim 2, comprising:

said buried region having a higher conductivity than said active region.

4. A lateral semiconductor device comprising:

an active region;

a base region of a first conductivity type formed in said active region;

a source region of a second conductivity type formed in said base region;

a drain region formed in said active region;

a plurality of trenches formed between said source and drain regions, said trenches having sidewalls;

an insulation layer formed on a surface region of said active region including said plurality of trenches;

a gate electrode formed in said trenches and over a portion of said active region disposed between said trenches through said insulation layer;

said gate electrode having a portion formed over said active region and extended toward said drain region; and a doped region of said second conductivity type formed in a surface region of said active region and connected to said drain region and extending between said base region and said drain region, said doped region having a conductivity higher than said active region and lower than said drain region;

wherein a thickness of said insulation layer under said portion of said gate electrode is greater than a thickness of said insulation layer formed on said sidewalls of said trenches.

5. A lateral semiconductor device comprising:

an active region;

a base region of a first conductivity type formed in said active region;

a source region of a second conductivity type formed in said base region;

a drain region formed in said active region;

a plurality of trenches formed between said source and drain regions;

a gate electrode formed in said trenches and over portions of said active region disposed between said trenches; and a buried region of said second conductivity type formed in contact with said drain region and extending toward said base region.

6. A device as recited in claim 5, comprising:

said buried region having a higher conductivity than said active region.

7. A device as recited in claim 5, comprising:

a doped region of said second conductivity type formed in a surface region of said active region and connected to said drain region and extending between said base region and said drain region.

8. A device as recited in claim 7, comprising:

said doped region having a conductivity higher than said active region and lower than said drain region.

9. A semiconductor device comprising a lateral MOSFET and bipolar transistor, said lateral MOSFET comprising:

a first active region;

a first base region of a first conductivity type formed in said first active region;

a source region of a second conductivity type formed in said first base region;

a drain region formed in said first active region;

a plurality of trenches formed between said source and drain regions;

a gate electrode formed in said trenches and over portions of said first active region disposed between said trenches; and a first buried region of said second conductivity type formed in contact with said drain region and extending toward said first base region;

said bipolar transistor comprising;

a second active region;

a collector region of a second conductivity type formed in said second active region;

a second base region of a first conductivity type formed on said collector region;

an emitter region of a second conductivity type formed on said second base region; and a second buried region of said second conductivity type formed in said second active region under said collector region;

wherein said first and second buried region are formed substantially with the same thickness and the same depth and the same concentration of a conductive impurity.

* * * * *